United States Patent
Kato et al.

(10) Patent No.: US 7,355,484 B2
(45) Date of Patent: Apr. 8, 2008

(54) OSCILLATOR AND RADAR APPARATUS USING THE SAME

(75) Inventors: Takatoshi Kato, Minoh (JP); Toru Ishii, Hirakata (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 17 days.

(21) Appl. No.: 10/578,322

(22) PCT Filed: Oct. 19, 2004

(86) PCT No.: PCT/JP2004/015394

§ 371 (c)(1),
(2), (4) Date: May 4, 2006

(87) PCT Pub. No.: WO2005/046047

PCT Pub. Date: May 19, 2005

(65) Prior Publication Data
US 2007/0040616 A1    Feb. 22, 2007

(30) Foreign Application Priority Data
Nov. 5, 2003 (JP) ............... 2003-375377

(51) Int. Cl.
H03B 1/00 (2006.01)
H03B 23/00 (2006.01)
H03L 7/16 (2006.01)
G01S 7/40 (2006.01)
G01S 13/00 (2006.01)

(52) U.S. Cl. ............... 331/4; 331/64; 331/77; 342/199; 342/200

(58) Field of Classification Search .......... 331/4, 331/16, 18, 25, 64, 77; 342/104, 118, 199, 342/200

See application file for complete search history.

(56) References Cited

U.S. PATENT DOCUMENTS 4,780,691 A  10/1988  Fiedziuszko
7,039,385 B1 *  5/2006  Hoffmann et al. ......... 455/340

FOREIGN PATENT DOCUMENTS

| DE | 1 141 382 | 12/1962 |
|---|---|---|
| DE | 690 17 867 T2 | 7/1995 |
| DE | 692 16982 T2 | 6/1997 |
| JP | 04-335701 | 11/1992 |
| JP | 8-162847 | 6/1996 |
| JP | 2000-216602 | 5/2000 |
| JP | 2001-257504 | 9/2001 |
| JP | 2002-156447 | 5/2002 |
| JP | 2003-294835 | 10/2003 |
| WO | WO-03/012986 A1 | 2/2003 |

OTHER PUBLICATIONS

International Search Report, PCT/JP2004/015394, Jan. 11, 2005.

* cited by examiner

*Primary Examiner*—David Mis
(74) *Attorney, Agent, or Firm*—Dickstein Shapiro LLP

(57) ABSTRACT

An oscillator and a radar apparatus that includes a resonator electro-magnetically connected to a micro strip line and a rotor connected to the resonator by capacitance. The bottom surface of the rotor has a changing height in the circumferential direction of the rotor. As the rotor is rotated, an actual oscillation frequency is recognized from the rotating angle of the rotor when an output of a detector has a peak. A modulation voltage supplied to a VCO is corrected in accordance with the result.

23 Claims, 21 Drawing Sheets

TO POINT (B) IN FIG. 1

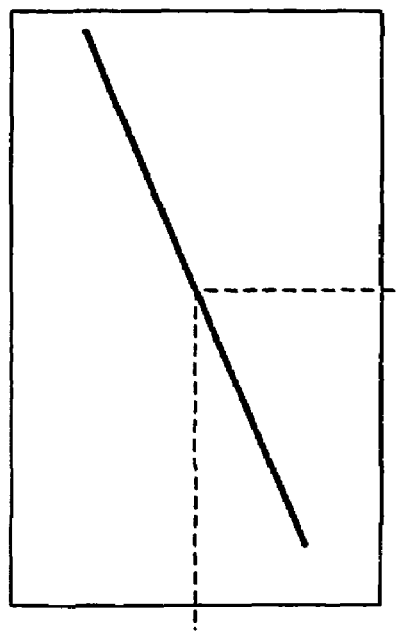
FIG. 6A
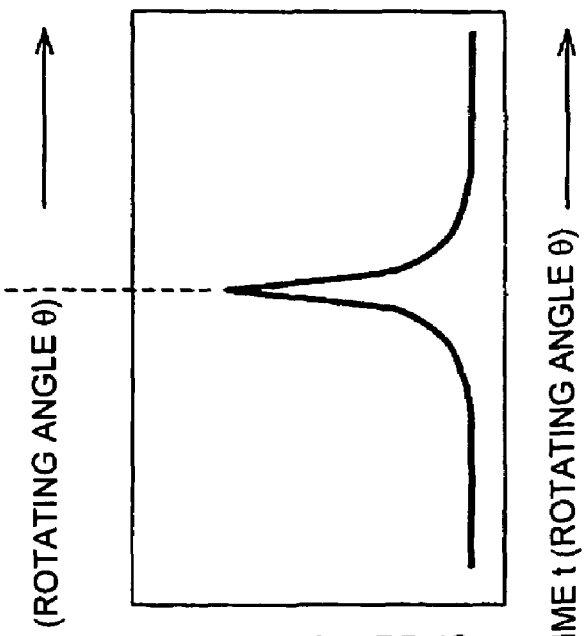
FIG. 6B
FIG. 6C

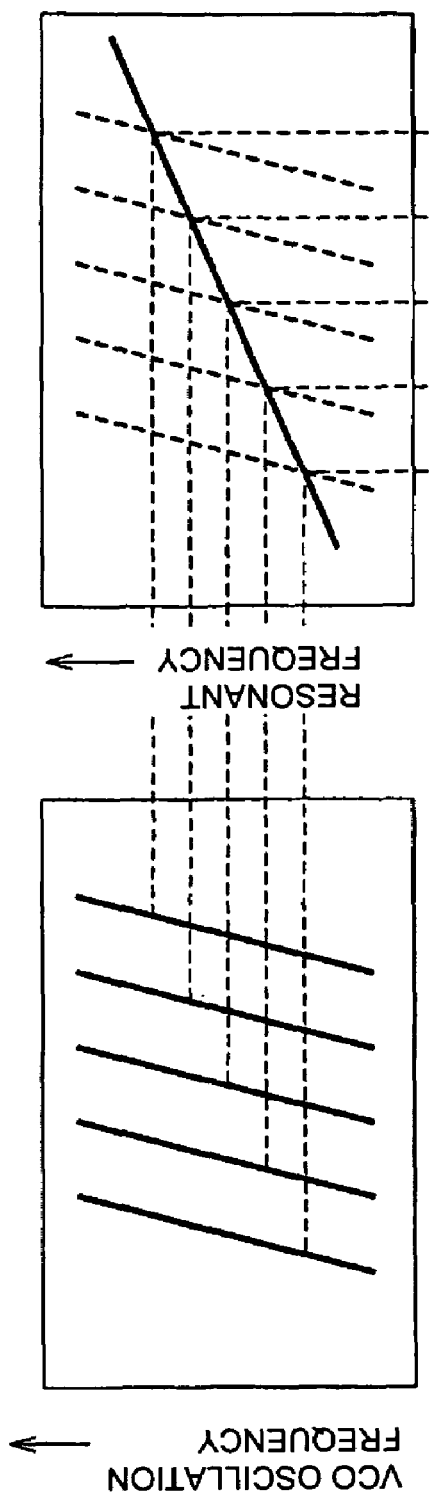
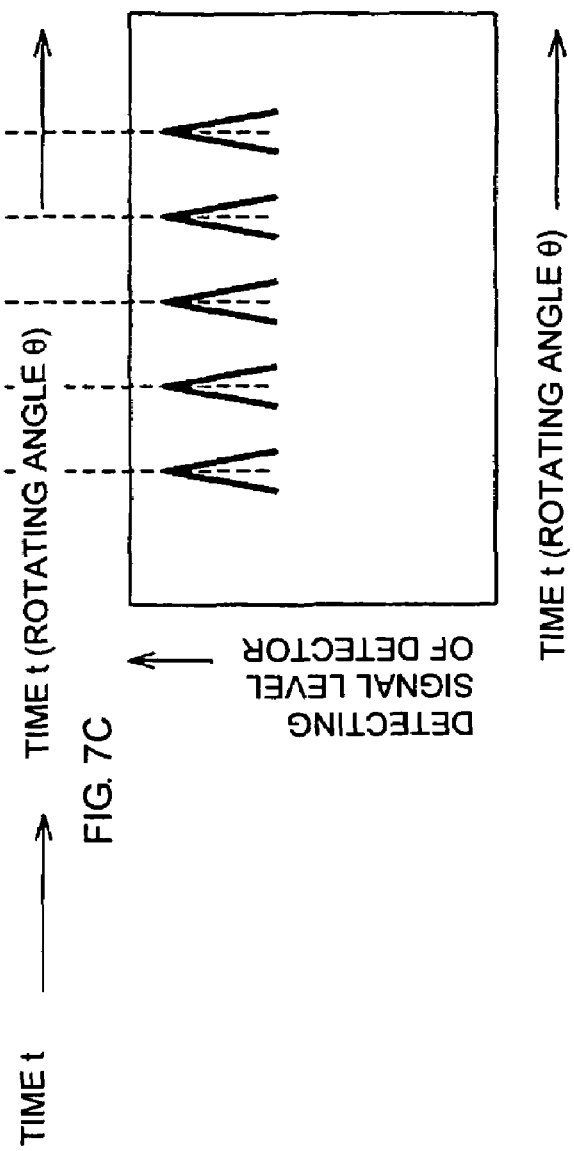
FIG. 7A
FIG. 7B
FIG. 7C

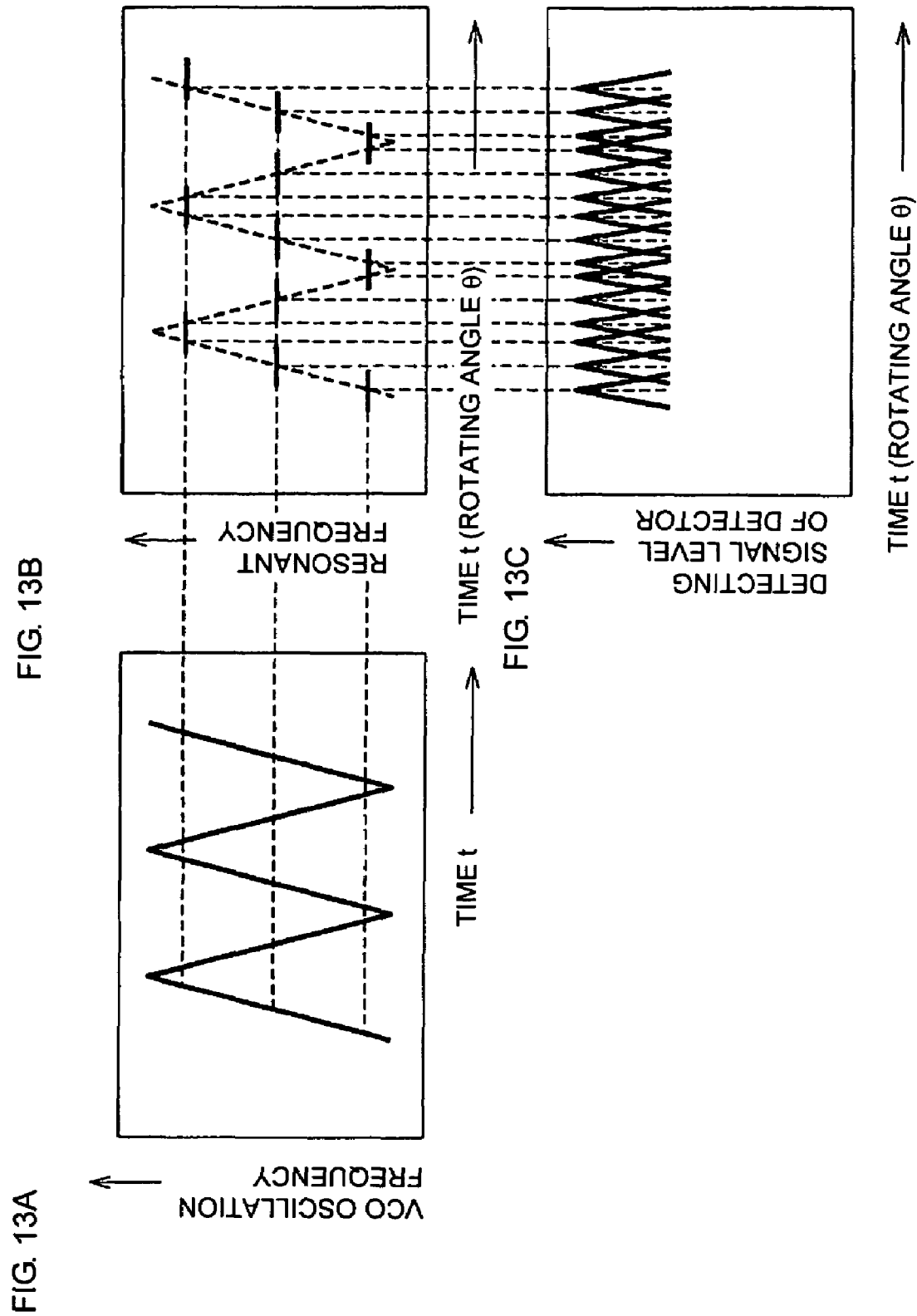

OSCILLATOR AND RADAR APPARATUS USING THE SAME

FIELD OF THE INVENTION

The present invention relates to an oscillator incorporated in a radar apparatus and used for a FM-CW radar apparatus, which is provided for a vehicle and is used for measurement of the distance between vehicles and the relative velocity.

BACKGROUND OF THE INVENTION

A FM-CW radar can measure the distance between vehicles and the relative velocity with, e.g., millimeter waves of 76 GHz without serious interference from the weather or the time of day with high precision. Therefore, the FM-CW radar has started to become partly provided for vehicles. The measurement principle is well-known. Based on the measurement principle, triangular modulation waves of 76 GHz as mentioned above are transmitted, the distance can be measured from the time delay (return time of reflection waves from a target) of reception waves, and the relative velocity can be measured on the basis of the frequency shift (the amount of Doppler shift) between transmission waves and reception waves due to the Doppler effect.

Specifically, the frequency shift and a time delay (Δt) are caused in the reception waves after the transmission waves are transmitted. Herein, the time delay (Δt) denotes the distance to the target, and the frequency shift denotes the relative velocity from the target. Further, a distance R to the target is obtained as follows.

$$2R = \Delta t \times C \text{ (where C=light velocity), i.e., } R = \Delta t \times C/2 \quad (A)$$

Herein, the relative velocity is 0 and reference symbol fr denotes a beat frequency. Thus, as the time delay Δt increases, the beat frequency fr is increased. Specifically, the following well-known relationship is satisfied.

$$\Delta t = fr/(2 \times \Delta F \times fm)$$

(where ΔF=modulation width of transmission waves and fm=repeating frequency)

This is substituted for (A) and the following relationship is obtained.

$$R = C \times fr/(4 \times \Delta F \times fm)$$

The distance R can be obtained on the basis of the beat frequency fr.

In the above description, the amount of Doppler shift is 0 (that is, the relative velocity is 0). Further, when the relative velocity is not 0, the following expression can be applied.

$$fr = (fb_1 + fb_2)/2$$

(where $fb_1$=beat frequency at the rising interval of the triangular modulation waves and $fb_2$=beat frequency at the falling interval of the triangular modulation waves).

When reference symbol fo denotes a carrier frequency of the transmission waves, the relative velocity V can be obtained as follows.

$$fd = (fb1 - fb2)/2$$

In this case, the relative velocity V can be obtained from the following expression.

$$V = C \cdot fd/(2 - fo)$$

As a consequence thereof, for the FM-CW radar, the triangular modulation waves with high linearity with a modulation width of 100 MHz need to be generated and further be modulated.

In order to obtain, for the FM-CW radar, the triangular modulation waves with high linearity, the following three methods can be considered.

1. The sensitivity for modulating the frequency uses a constant VCO.
2. As disclosed in Patent Document 1, linear modulation waves are obtained by distorting a modulation signal in the reverse direction so as to set the constant sensitivity for modulating the frequency.
3. As disclosed in Patent Document 2, an oscillation frequency is monitored in realtime and, when the frequency is shifted, the frequency is corrected by using a closed loop.

Patent Document 1: Japanese Unexamined Patent Application Publication No. 8-18343 (publication date: Jan. 19, 1996)

Patent Document 2: Japanese Unexamined Patent Application Publication No. 6-120735 (publication date: Apr. 28, 1994)

The realization of method 1 needs VCO with high modulating characteristic. However, the VCO cannot be realized.

Further, the method 2 uses a low-frequency circuit, thereby relatively easily obtaining preferable linearity. However, the method is based on the open-loop correction. Thus, the change in VCO characteristic causes a problem of the shift of characteristic. A correcting circuit increases costs.

Furthermore, a typical one of the method 3 is PLL (Phase Locked Loop). The use of the PLL enables the relatively easy acquisition of the triangular modulation waves with high linearity and also enables the correction even with the aging change in VCO characteristic. However, the PLL has such a problem that a reference oscillator and a frequency divider are necessary and the structure is thus complicated with increased costs. In addition, millimeter waves need to be converted-down for the purpose of the comparison with the reference signal, and a circuit for the converting-down operation is complicated and the costs are further increased. A method of FLL (Frequency Locked Loop) is similar to the PLL. However, the FLL needs the reference oscillator and the costs are increased.

As a consequence thereof, all the above-mentioned methods have technology problems and increase the costs.

SUMMARY OF THE INVENTION

It is an object of the present invention to provide an oscillator and a radar apparatus which correct a high-frequency signal with low costs.

According to the present invention, an oscillator for outputting an oscillation signal of a voltage control oscillator via a transfer line comprises: a variable resonator that is electro-magnetically connected to the transfer line, receives at least one part of the oscillation signal, and mechanically changes a resonant frequency in response to a control signal; a detector that detects a resonant output of the variable resonator; and a correcting circuit that transmits the control signal to the variable resonator, receives the output from the detector while sweeping the resonant frequency, and corrects a frequency of the oscillation signal to a desired frequency under the control of a modulation voltage sent to the voltage control oscillator.

With the above-mentioned structure, the oscillator is compatible with a high-frequency signal and is used for an FM-CW radar apparatus. In the oscillator that outputs the oscillation signal generated by the voltage control oscillator (VCO) via the transfer line, the frequency of the oscillation signal can match a desired frequency without the frequency shift. With the detector, a transmission-type or reflection type variable resonator recognizes a frequency at which a peak value is output, and a reaction-type variable resonator recognizes a frequency at which a dip value is output, as an actual oscillation frequency of the voltage control oscillator. The correcting circuit controls an actual modulation voltage sent to the voltage control oscillator, depending on the shift between the actual oscillation frequency and the oscillation frequency, serving as a target of the modulation voltage output in the recognition.

As a consequence thereof, the oscillation frequency can be corrected to a desired frequency without using an expensive circuit, such as PLL.

Further, in the oscillator according to the present invention, the variable resonator comprises: a resonator; and a rotor that is arranged in proximity of the resonator and changes the shape thereof in the circumferential direction, the rotation of the rotor changes the distance between the resonator and the rotor, and the resonant frequency of the resonator changes.

With the above-mentioned structure, it is possible to form a variable resonator that can mechanically change the resonant frequency.

Further, in the oscillator according to the present invention, the variable resonator is a cavity resonator, a part of a cavity forming the cavity resonator is a rotor formed by changing the shape thereof in the circumferential direction, the rotation of the rotor changes the inner dimension of the cavity, and the resonant frequency of the cavity resonator changes.

With the above-mentioned structure, it is possible to form a variable resonator that can mechanically change the resonant frequency.

Further, in the oscillator according to the present invention, the rotor has a projected wall that continuously increases in height on the outer circumference on the undersurface of a disc portion.

With the above-mentioned structure, the rotation of the rotor continuously reduces the interval between the resonator and the rotor, and one rotation thereof allows the interval to return to the maximum one.

As a consequence thereof, the continuous rotation of the rotor can sweep the oscillation signal like zigzag waves.

Further, in the oscillator according to the present invention, the rotor has a projected wall with an equal height, with which the position in the radial direction changes from the outer circumference to the inner circumference on the undersurface of the disc portion, in relation to the change in the circumferential direction.

With the above-mentioned structure, the rotation of the rotor continuously reduces or increases the interval between the resonator and the rotor, and one rotation thereof allows the interval to return to the maximum one or the minimum one.

As a consequence thereof, the continuous rotation of the rotor can sweep the oscillation signal like zigzag waves.

Further, in the oscillator according to the present invention, the rotor has a projected wall that continuously increases the height thereof throughout the half (0° to 180°) of the outer circumference on the undersurface of a disc portion and continuously reduces the height thereof throughout the remaining half (180° to 360°).

With the above-mentioned structure, the rotation of the rotor continuously reduces the interval between the resonator and the rotor, and the half rotation gives the minimum interval. Thereafter, the rotation continuously increases the interval, and one rotation gives the maximum interval.

As a consequence thereof, the continuous rotation of the rotor can sweep the oscillation signal like triangular modulation waves.

Further, in the oscillator according to the present invention, the variable resonator comprises: a resonator that is placed in a cavity; and a piezoelectric actuator that is arranged facing the resonator, the expansion and contraction of the piezoelectric actuator changes the inner dimension of the cavity, and the resonant frequency of the resonator thus changes.

With the above-mentioned structure, it is possible to form a variable resonator that can mechanically change the resonant frequency.

Further, the oscillator according to the present invention further comprises, in place of the correcting circuit, an abnormality detecting circuit that transmits the control signal to the variable resonator, receives the output from the detector while sweeping the resonant frequency to the variable resonator, detects the oscillation frequency of the voltage control oscillator, and detects the abnormality of the oscillation frequency and/or a modulation width of the oscillation frequency.

With the above-mentioned structure, it is possible to transmit a notification indicating the abnormality of the oscillation frequency, the abnormality of linearity, and the abnormality of the modulation width to an upper system.

Further, in the oscillator according to the present invention, the variable resonator comprises: a resonator; and a variable reactance device, the variable reactance device comprises: a transfer line that is electro-magnetically connected to the resonator; and a rotor that is arranged in proximity of the transfer line and changes the shape thereof in the circumferential direction, the rotation of the rotor changes the reactance in view of the transfer line, and a resonant frequency of the variable resonator changes.

With the above-mentioned structure, in the variable reactance device, the rotor comprising a conductor or a dielectric is arranged in proximity of the transfer line comprising a coplanar line, a micro strip line or a slot. When the rotor is the conductor, capacitance is generated between the conductor and the transfer line. When the rotor is the dielectric, capacitance is generated to the dielectric. The rotor is formed to change the shape thereof in the circumferential direction and, thus, the rotation of the rotor changes the reactance. For example, projected and caved portions are continuously formed in the circumferential direction, thereby periodically changing the reactance. The variable reactance device can change the resonant frequency of the variable resonator. That is, with the variable reactance device, in the case of using a high-frequency signal with millimeter waves, an electrical method cannot change the reactance. On the other hand, a mechanical method can change the reactance, and high linearity and high frequency characteristic can be obtained with low costs. Thus, the oscillator can be provided with low costs.

Further, in the oscillator according to the present invention, at least one part of the rotor facing the transfer line is conductive, and capacitance is generated between the transfer line and the rotor.

With the above-mentioned structure, in the variable reactance device, a rotor comprising a metallic material or a metallized insulator is used. The change in shape of the rotor in the circumferential direction rotates the rotor, thereby changing the reactance generated between the transfer line and the rotor. Thus, variable reactance can be specifically realized, and an oscillator can be formed.

Further, in the oscillator according to the present invention, the rotor has a projected wall that is meandered roughly like a ring in the radial direction on the undersurface of a disc portion.

With the above-mentioned structure, the projected wall is formed like a wall with an equal height projected from the undersurface of the disc portion. The projected wall is roughly circular and is periodically meandered like triangular modulation waves. Further, a plurality of projected walls may be formed in parallel therewith. As a consequence thereof, the rotation of the rotor changes the position of the capacitance on the transfer line, and the change in position of the capacitance varies the reactance. Thus, variable reactance can be specifically realized, and an oscillator can be formed.

Further, in the oscillator according to the present invention, the rotor is formed by extending an outer wall from the undersurface of a disc portion, and the thickness of the outer wall periodically changes in the circumferential direction.

With the above-mentioned structure, the rotor is formed by extending the outer wall from the undersurface of the disc portion. The thickness of the outer wall is periodically changed like triangular modulation waves in the circumferential direction. As a consequence thereof, the rotation of the rotor changes the electrode area on the transfer line, the capacitance changes, and the change in capacitance varies the reactance. Thus, variable reactance can be specifically realized, and an oscillator can be formed.

Further, in the oscillator according to the present invention, the rotor is formed by extending an outer wall from the undersurface of a disc portion, and the height of the outer wall periodically changes in the circumferential direction.

With the above-mentioned structure, the rotor is formed by extending the outer wall from the undersurface of the disc portion. The height of the outer wall periodically changes like triangular modulation waves in the circumferential direction. As a consequence thereof, the rotation of the rotor changes the distance to the transfer line, the capacitance changes, and the change in capacitance varies the reactance. Thus, variable reactance can be specifically realized, and an oscillator can be formed.

Further, in the oscillator according to the present invention, the rotor has projected and caved portions that are repeatedly formed in the circumferential direction on the outer circumference thereof. The transfer line is a micro strip line, and the capacitance is generated between an opening end of the micro strip line and the outer-circumferential surface of the rotor.

With the above-mentioned structure, the rotor has projected and caved portions that are repeatedly formed in the circumferential direction on the outer circumference thereof. The projected and caved portions periodically changes like triangular modulation waves. The transfer line comprises a micro strip line, and the capacitance is generated between the opening end of the micro strip line and the outer-circumferential surface of the rotor. As a consequence thereof, the rotation of the rotor changes the distance between the opening end and the rotor, the capacitance changes, and the change in capacitance varies the reactance. Thus, variable reactance can be specifically realized, and an oscillator can be formed.

Further, in the oscillator and variable reactance device according to the present invention, the transfer line is a coplanar line, and capacitance is generated between a line conductor of the coplanar line and the rotor and between a ground conductor of the coplanar line and the rotor.

With the above-mentioned structure, the transfer line comprises the coplanar line, and the projected wall formed on the undersurface of the disc portion of the rotor as mentioned faces the coplanar line. The capacitance is generated between the line conductor of the coplanar line and the rotor and between the ground conductor of the coplanar line and the rotor. The above-mentioned rotation of the rotor changes the position of the capacitance, thereby changing the reactance. Thus, variable reactance can be specifically realized, and an oscillator can be formed.

In the oscillator according to the present invention, a pair of the rotors is arranged to sandwich the transfer line, and the rotors are rotated in conjunction therewith.

With the above-mentioned structure, even when the rotor is displaced in the shaft direction, the total of intervals between the two rotors and the transfer line is always constant. As a consequence thereof, even the occurrence of the shaft displacement reduces the change in capacitance generated between the transfer line and the rotors. Thus, variable reactance can be specifically realized, and an oscillator can be formed.

In the oscillator according to the present invention, the rotor comprises a dielectric having a projected wall that is roughly ring-shaped on the undersurface of a disc portion and is meandered in the radial direction, and the transfer line comprises a coplanar line.

With the above-mentioned structure, the projected wall is formed like a wall with an equal height, projected from the undersurface of the disc portion. Further, the projected wall is roughly circular, and is periodically meandered like triangular modulation waves. Alternatively, a plurality of projected walls may be formed in parallel therewith. As a consequence thereof, the rotation of the rotor changes the position of the capacitance on the transfer line. The change in capacitance can change the reactance. Thus, variable reactance can be specifically realized, and an oscillator can be formed.

In the oscillator according to the present invention, the rotor comprises a dielectric, the transfer line comprises a coplanar line, and the rotation of the rotor changes the distance between the rotor and the transfer line.

With the above-mentioned structure, the change in shape of the rotor comprising the dielectric in the circumferential direction thereof rotates the rotor, thereby changing the distance between the rotor and the transfer line. The rotation changes the capacitance generated between the line conductor of the coplanar line and the ground conductor, thereby changing the reactance. Thus, variable reactance can be specifically realized, and an oscillator can be formed.

A radar apparatus according to the present invention comprises the oscillator.

With the above-mentioned structure, a mechanical method realizes the change in reactance, and it is possible to realize the radar apparatus in which signals are modulated to triangular modulation waves with high linearity, high frequency characteristic, and low costs.

Further, a radar apparatus according to the present invention comprises the oscillator, the rotor comprises a primary radiator, the rotation of the rotor changes a resonant frequency of the variable resonator, and the primary radiator scans radar waves radiated from the primary radiator in the radial direction.

With the above-mentioned structure, when the primary radiator scans radiated radar waves, the primary radiator is formed integrally with the rotor that changes the resonant frequency of the variable resonator.

As a consequence thereof, the structure of a scan-type radar apparatus can be simplified.

As mentioned above, the oscillator according to the present invention for outputting an oscillation signal of a voltage control oscillator via a transfer line comprises: a variable resonator that is electro-magnetically connected to the transfer line, receives at least one part of the oscillation signals, and mechanically changes a resonant frequency in response to a control signal; a detector that detects a resonant output of the variable resonator; and a correcting circuit that transmits the control signal to the variable resonator, receives the output from the detector while sweeping the resonant frequency, and corrects a frequency of the oscillation signal to a desired frequency under the control of a modulation voltage sent to the voltage control oscillator.

The oscillator is suitable to a high-frequency signal and is used for an FM-CW radar apparatus. In the oscillator that outputs the oscillation signal generated by the voltage control oscillator (VCO) via the transfer line, the frequency of the oscillation signal can match a desired frequency without the frequency shift. With the detector, a transmission-type or reflection type variable resonator recognizes a frequency at which a peak value is output, and a reaction-type variable resonator recognizes a frequency at which a dip value is output, as an actual oscillation frequency of the voltage control oscillator. The correcting circuit controls an actual modulation voltage sent to the voltage control oscillator, depending on the shift between the actual oscillation frequency and the oscillation frequency, serving as a target of the modulation voltage output in the recognition.

As a consequence thereof, the oscillation frequency can be corrected to a desired frequency without using an expensive circuit, such as PLL.

Further, in the oscillator according to the present invention, as mentioned above, the variable resonator comprises: a resonator; and a rotor that is arranged in proximity of the resonator and changes the shape thereof in the circumferential direction, the rotation of the rotor changes the distance between the resonator and the rotor, and the resonant frequency of the resonator changes.

Therefore, it is possible to specifically realize the variable resonator that can mechanically change the resonant frequency.

In the oscillator according to the present invention, as mentioned above, the variable resonator is a cavity resonator, a part of a cavity forming the cavity resonator is a rotor formed by changing the shape thereof in the circumferential direction, the rotation of the rotor changes the inner dimension of the cavity, and the resonant frequency of the cavity resonator changes.

Therefore, it is possible to specifically realize the variable resonator that can mechanically change the resonant frequency.

In the oscillator according to the present invention, as mentioned above, the rotor has a projected wall that continuously increases in height on the outer circumference on the undersurface of a disc portion. The rotation of the rotor continuously reduces the interval between the resonator and the rotor, and one rotation thereof allows the interval to return to the maximum one.

As a consequence thereof, the continuous rotation of the rotor can sweep the oscillation signal like zigzag waves.

Further, in the oscillator according to the present invention, the rotor has a projected wall with an equal height, with which the position in the radial direction changes from the outer circumference to the inner circumference on the undersurface of the disc portion, in relation to the change in the circumferential direction. The rotation of the rotor continuously reduces or increases the interval between the resonator and the rotor, and one rotation thereof allows the interval to return to the maximum one or the minimum one.

As a consequence thereof, the continuous rotation of the rotor can sweep the oscillation signal like zigzag waves.

Further, in the oscillator according to the present invention, as mentioned above, the rotor has a projected wall that continuously increases in height throughout the half (0° to 180°) of the outer circumference on the undersurface of a disc portion and continuously reduces in height throughout the remaining half (180° to 360°). The rotation of the rotor continuously reduces the interval between the resonator and the rotor, and the half rotation gives the minimum interval. Thereafter, the rotation continuously increases the interval, and one rotation gives the maximum interval.

As a consequence thereof, the continuous rotation of the rotor can sweep the oscillation signal like triangular modulation waves.

Further, in the oscillator according to the present invention, as mentioned above, the variable resonator comprises: a resonator that is placed in a cavity; and a piezoelectric actuator that is arranged facing the resonator, the expansion and contraction of the piezoelectric actuator changes the inner dimension of the cavity, and the resonant frequency of the resonator thus changes.

Therefore, it is possible to specifically realize the variable resonator that can mechanically change the resonant frequency.

Further, the oscillator according to the present invention further comprises, in place of the correcting circuit, an abnormality detecting circuit that transmits the control signal to the variable resonator, receives the output from the detector while sweeping the resonant frequency to the variable resonator, detects the oscillation frequency of the voltage control oscillator, and detects the abnormality of the oscillation frequency and/or a modulation width of the oscillation frequency.

Therefore, it is possible to transmit a notification indicating the abnormality of the oscillation frequency, the abnormality of linearity, and the abnormality of the modulation width to an upper system.

Further, as mentioned above, the radar apparatus according to the present invention comprises the oscillator.

Therefore, it is possible to realize the radar apparatus in which signals are modulated to triangular modulation waves with high linearity, high frequency characteristic, and low costs.

Further, as mentioned above, the radar apparatus according to the present invention comprises the oscillator, the rotor comprises a primary radiator, the rotation of the rotor changes a resonant frequency of the variable resonator, and the primary radiator scans radar waves radiated from the primary radiator in the radial direction.

Therefore, the structure of a scan-type radar apparatus can be simplified.

BRIEF DESCRIPTION OF THE DRAWINGS

FIGS. 6A-6C are graphs explaining one measurement operation of an oscillation frequency of a correcting circuit.

FIGS. 7A-7C are graphs explaining another measurement operation of the oscillation frequency of the correcting circuit.

FIGS. 13A-13C are graphs explaining another measurement operation of the oscillation frequency of the correcting circuit.

Figure 1:
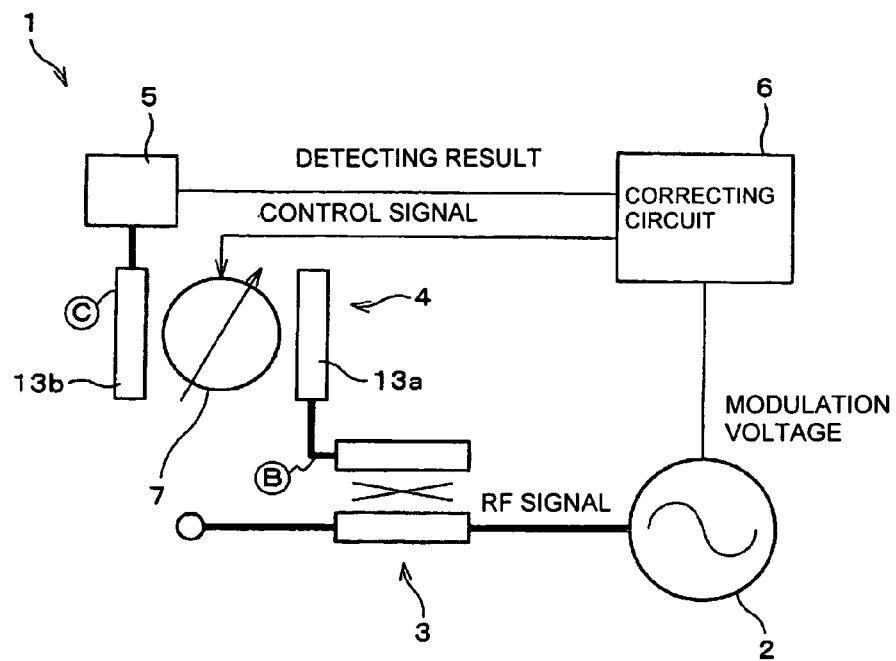
FIG. 1 is a block diagram showing the electrical structure of an oscillator 1 used for an FM-CW radar according to the first embodiment of the present invention.

REFERENCE NUMERALS 1, 71 oscillator
2 VCO
3 directional coupler
4 transmission-type resonant circuit
5 detector
6 correcting circuit
7 variable resonator
11; 11a, 11b, 11c, 11d; 52; 62; 92 rotor
12 resonator
13 micro strip line
13a, 13b terminal
14 reaction-type resonant circuit
24 reflection-type resonant circuit
31, 53 disc portion
32, 33, 34, 35 projected wall
41 piezoelectric actuator
51, 61 variable reactance device
93 outer wall
56, 96 board
72 abnormality detecting circuit
81, 101 radar module (radar apparatus)
82, 106 primary radiator
83 circulator
95 detector board
102 antenna
115 motor

DESCRIPTION OF THE INVENTION

First Embodiment

Hereinbelow, the first embodiment of the present invention will be described with reference to FIGS. 1 to 14.

FIG. 1 is a block diagram showing the electrical structure of an oscillator 1 used for the FM-CW radar according to the first embodiment of the present invention. The oscillator 1 is mainly oscillated by a VCO 2, and partly guides RF signals, serving as transmission radar waves, to a detector 5 from a directional coupler 3 via a transmission-type resonant circuit 4. The correcting circuit 6 controls a modulation voltage supplied to the VCO 2 in response to the detecting result of the detector 5.

Specifically, the transmission-type resonant circuit 4 functions as a filter, and the correcting circuit 6 supplies a control signal to the variable resonator 7 of the transmission-type resonant circuit 4 and mechanically sets and sweeps the resonant frequency. The resonant frequency of the variable resonator 7, corresponding to the control signal, is obtained in advance and is stored in the correcting circuit 6. As a consequence thereof, the correcting circuit 6 accurately identifies the frequency of the current RF signal from the timing of the control signal when the detecting result of the detector 5 reaches the peak, calculates the difference between a desired oscillation frequency and an actual oscillation frequency, and corrects the modulation voltage.

As mentioned above, the closed loop with the above structure is operated as PLL, and the frequency of the RF signal can be accurately set to a desired frequency. However, according to the present invention, the oscillator of millimeter waves like the FM-CW radar does not need the dividing circuit for converting-down operation and the reference oscillator. Unlike the structure of the PLL, the high-frequency signal can be modulated with low costs.

Figure 2:
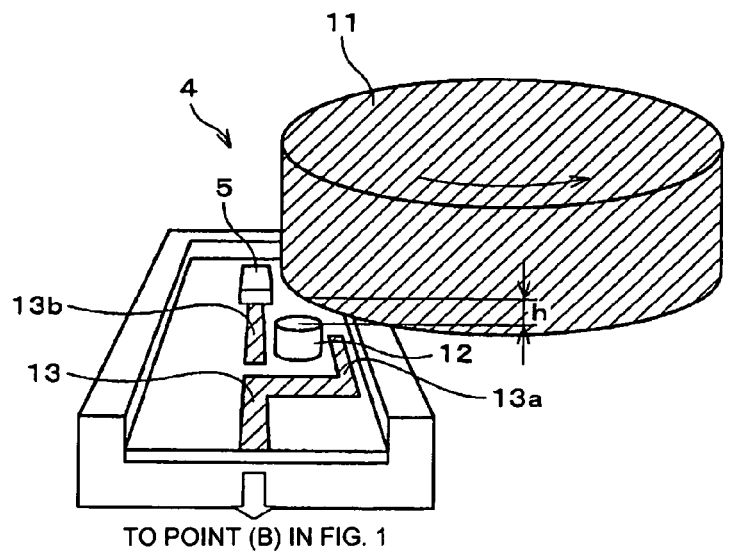
FIG. 2 is a perspective view showing the structure for changing a resonant frequency of a transmission-type resonant circuit in the oscillator shown in FIG. 1.
Figure 3:
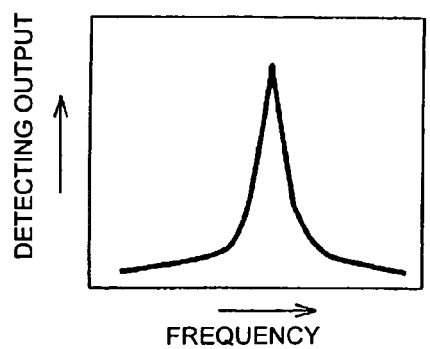
FIG. 3 is a graph showing transmission characteristics of the transmission-type resonant circuit and a reflection-type resonant circuit.

FIG. 2 is a perspective view showing the structure for changing the resonant frequency of the transmission-type resonant circuit 4 in the oscillator 1 shown in FIG. 1. The oscillator 1 comprises: a rotor 11 that is rotated by a motor (not shown); a resonator 12 that is coupled by capacitance to the rotor 11; a micro strip line 13; and the detector 5. Referring to FIG. 2, the correcting circuit 6, the VCO 2, the directional coupler 3, and a negative-resistance circuit are not shown. The rotor 11 and the resonator 12 form the variable resonator 7. Further, terminals 13a and 13b of the micro strip line 13, electro-magnetically connected to the variable resonator 7, are added, thereby forming the transmission-type resonant circuit 4. The transmission-type resonant circuit 4 functions as a resonant filter. Referring to FIG. 3, with the transmission characteristic of the transmission-type resonant circuit 4, only components near a peak resonant frequency pass through the transmission-type resonant circuit 4.

The resonator 12 is a TE01δ dielectric resonator. In this case, the resonator 12 has the rotor that is in proximity of the upper portion of the resonator 12 and contains a metallic material or is formed by metallizing a resin material. Alternatively, the rotor 11 comprising a dielectric is arranged to the resonator 12. As will be described later, the rotor 11 comprising the conductor is shaped by closing both ends of a cylindrical member thereof. Alternatively, the rotor 11 comprising the dielectric is shaped to be cylindrical with a solid core and is formed by changing the shape thereof in the circumferential direction. When an end plate for closing the end of the cylindrical member is formed with the change in shape, projections and cavities are formed on the bottom surface thereof. Further, the resonator 12 can use a TE-mode dielectric resonator, a TM-mode dielectric resonator, a coaxial dielectric resonator, a micro strip resonator, and a waveguide cavity resonator, in addition to the TE01δ dielectric resonator. When the resonator 12 is a TM-mode resonator, the side of the resonator may be close to the projected and caved portion of the rotor 11. The detector 5 comprises a shot-key barrier diode.

As a consequence thereof, the rotation of the rotor 11 changes a height h of the bottom surface of the rotor 11. The rotation changes the dimension of the resonant cavity, thereby changing the resonant frequency. In the case of using a high-frequency signal, such as millimeter waves, the above-mentioned electrical method cannot change the resonant frequency. On the other hand, the mechanical method can realize the change in resonant frequency and the high linearity and frequency characteristic can be obtained with low costs.

Next, a description is given of the specific shape of the rotor 11 and the specific operation for detecting a peak frequency generated by the resonance. Hereinbelow, as a resonant circuit, the transmission-type resonant circuit 4 or the reaction-type resonant circuit 24 (FIG. 19) is used. That is, a peak output is obtained by the resonant frequency.

Figure 4:
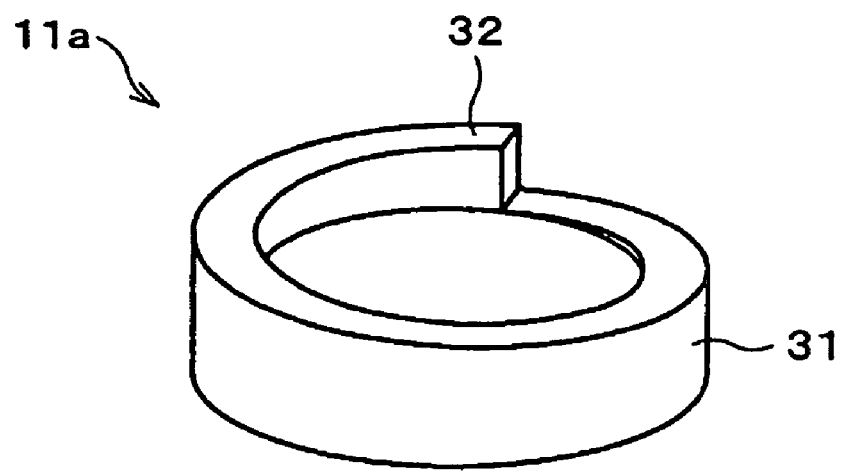
FIG. 4 is a perspective view showing the structure of a rotor as one example thereof on the bottom side.
Figure 5:
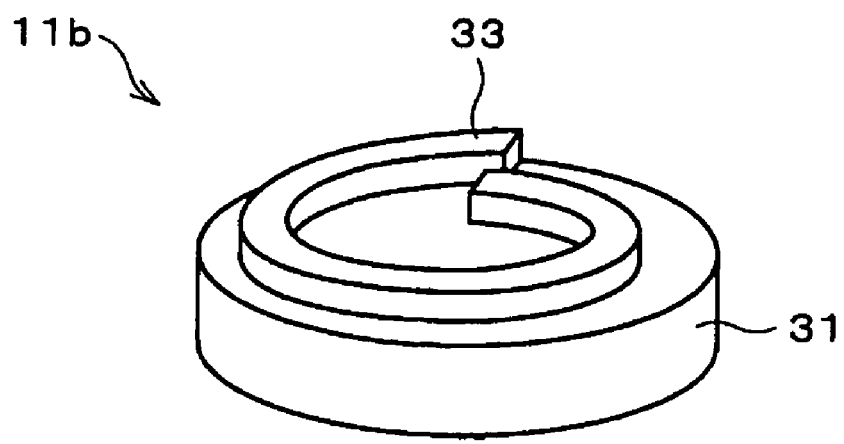
FIG. 5 is a perspective view showing the structure of the rotor as another example thereof on the bottom side.

FIG. 4 is a perspective view showing the structure of a rotor 11a as one example of the rotor 11 on the bottom side. The rotor 11a comprises, on the undersurface of the disc portion 31, a projected wall 32 that continuously increases the height thereof throughout the entire circumference of 360° on the outer circumference. Further, FIG. 5 is a perspective view showing the structure of a rotor 11b as another example of the rotor 11 on the bottom side. The rotor 11b comprises, on the undersurface of the disc portion 31, a projected wall 33 with an equal height so that the position thereof in the radial direction changes from the outer circumference to the inner circumference in relation to the change in the circumferential direction.

Referring to FIG. 6A, the correcting circuit 6 sets the oscillation frequency of the VCO 2, i.e., the modulation voltage supplied to the VCO 2 to be constant with the rotors 11a and 11b. Referring to FIG. 6B, the rotors 11a and 11b are rotated. The known rotating angles of the rotors 11a and 11b are measured on the basis of a detecting result shown in FIG. 6C obtained by the detector 5. That is, an actual oscillation frequency of the VCO 2 at the modulation voltage is measured on the basis of a relationship between control voltages supplied to the rotors 11a and 11b and the resonant frequencies.

The similar processing is performed every small-change of the oscillation frequency of the VCO 2, thereby forming a table indicating a relationship between the modulation voltage and the oscillation frequency. As mentioned above, it is possible to know the dependence, of the frequency modulation of the VCO 2, on the modulation voltage. The result is stored in the memory. In order to obtain the waveform of desired triangular modulation waves upon transmitting the radar waves, that is, to set the modulation frequency to be linear, the modulation voltage is corrected and the corrected voltage is transmitted to the VCO 2. Thus, it is possible to accurately set the frequency of the RF signal to a desired frequency.

Further, unlike the setting of the oscillation frequency of the VCO 2 to be constant with the rotors 11a and 11b as shown in FIG. 6A, referring to FIG. 7A, the VCO 2 is modulated at the period faster than those of the rotations of the rotors 11a and 11b. In this case, similar to FIG. 6B, the rotating velocities of the rotors 11a and 11b are not changed as shown in FIG. 7B. Then, it is possible to know, from the detector 5, the oscillation frequency of the VCO 2 at a plurality of modulation voltages during one rotation of the rotors 11a and 11b as shown in FIG. 6C. As a consequence thereof, the accurate time management and rotating-angle management enable the dependence on the modulation voltage of the frequency modulation of the VCO 2 for a short time. The result is stored to the memory. The modulation voltage can be corrected so that the modulation frequency is linear as mentioned above.

Figure 8A:
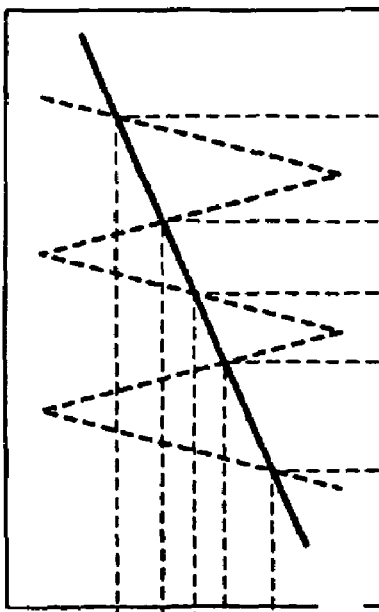
FIGS. 8A-8C are graphs explaining another measurement operation of the oscillation frequency of the correcting circuit.
Figure 8B:
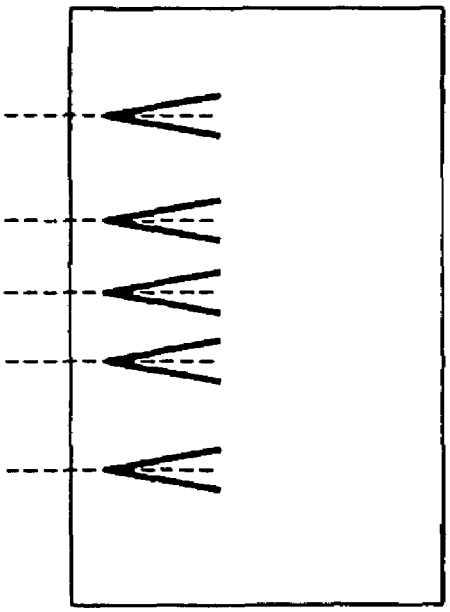
Figure 8C:
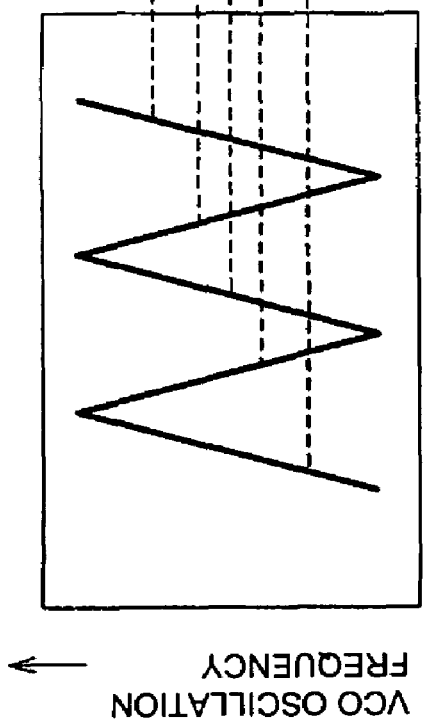

FIGS. 8A-8C show the detecting result when the VCO 2 oscillates the triangular modulation waves while rotating the rotors 11*a* and 11*b*. That is, the modulation voltage is applied to the VCO 2 on the basis of the dependence on the frequency modulation of the VCO 2, stored in the memory. Referring to FIG. 8A, the triangle modulation is performed. In this case, the rotors 11*a* and 11*b* are rotated, thereby changing the resonant frequency of the resonator as shown in FIG. 8B. Thus, a detecting result shown in FIG. 8C can be obtained. It is possible to know whether or not the oscillation frequency of the VCO 2 is accurately triangle-modulated on the basis of the detecting result and a relationship between the well-known rotating angle θ of the rotor and the resonant frequency of the resonator.

Figure 9:
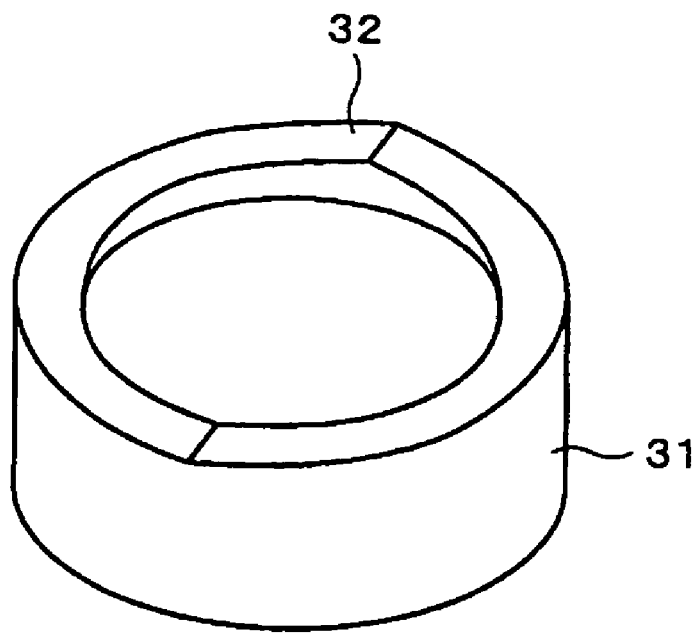
FIG. 9 is a perspective view showing the structure of the rotor as another example thereof on the bottom side.
Figure 10A:
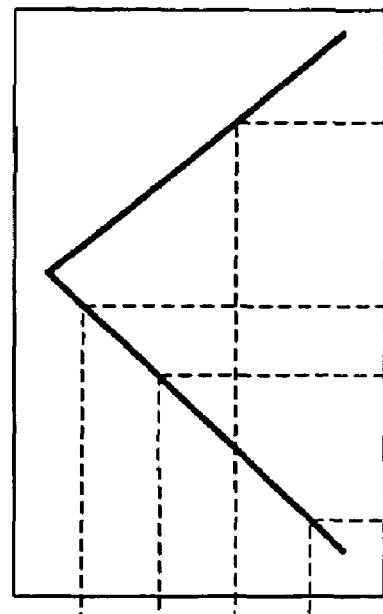
FIGS. 10A-10C are graphs explaining another measurement operation of the oscillation frequency of the correcting circuit.
Figure 10B:
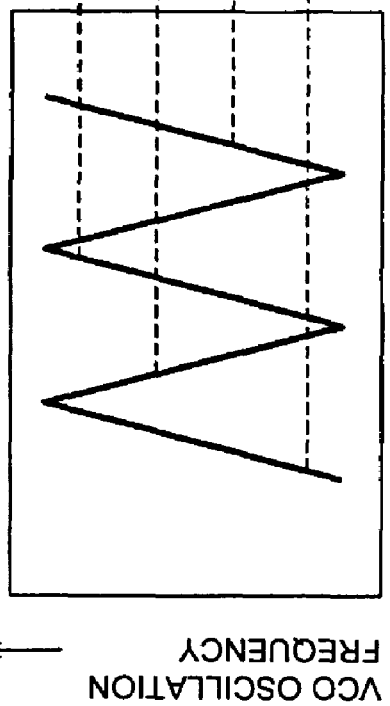
Figure 10C:
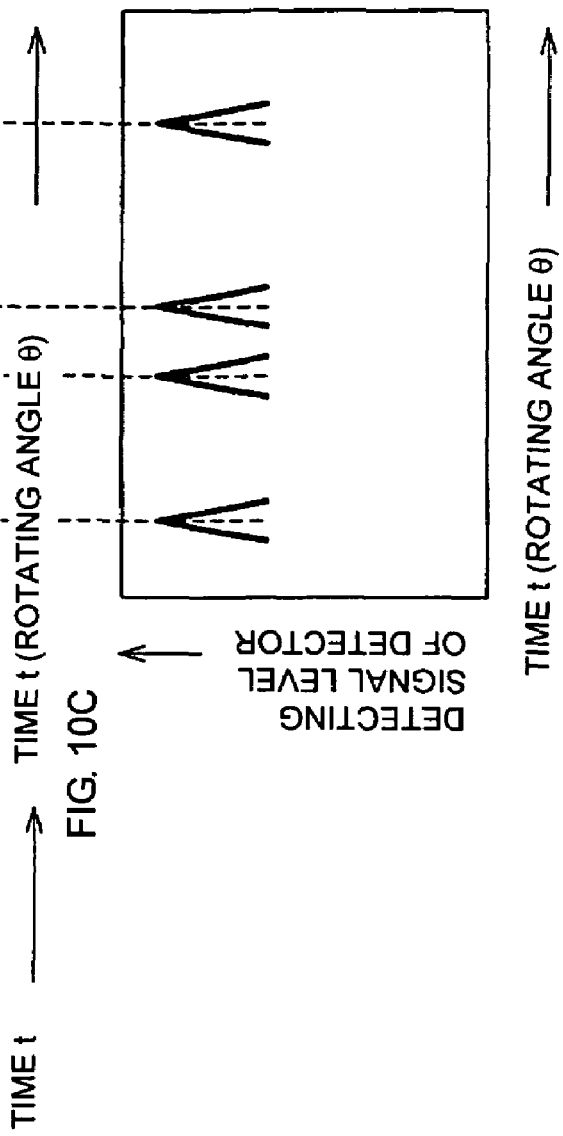

FIG. 9 is a perspective view showing the structure of a rotor 11*c* as another example of the rotor 11 on the bottom side. The rotor 11*c* has the projected wall 32 that continuously increases in height throughout the half circumference on the outer circumference on the undersurface of the disc portion 31 and continuously reduces in height throughout the remaining half circumference. In this case, the resonant frequency of the resonator changes as shown in FIG. 10B. The VCO 2 is triangle-modulated as shown in FIG. 10A. In this case, a detecting signal shown in FIG. 10C can be obtained from the detector 5. It is possible to know whether or not the VCO 2 is correctly triangle-modulated.

Figure 11:
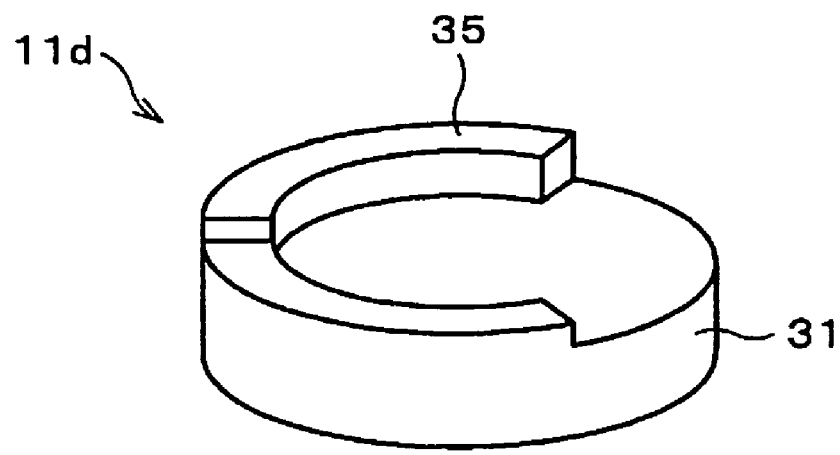
FIG. 11 is a perspective view showing the structure of the rotor as another example thereof on the bottom side.
Figure 12A:
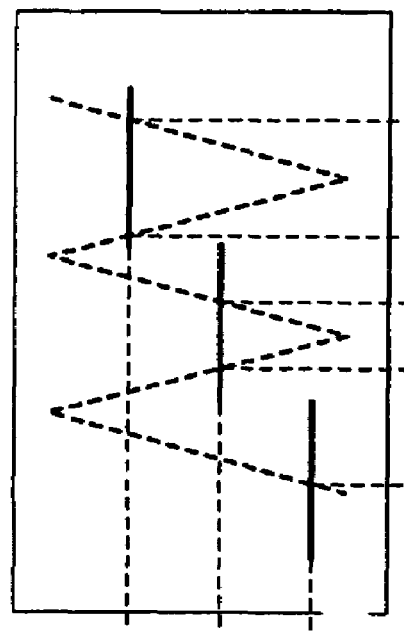
FIGS. 12A-12C are graphs explaining another measurement operation of the oscillation frequency of the correcting circuit.
Figure 12B:
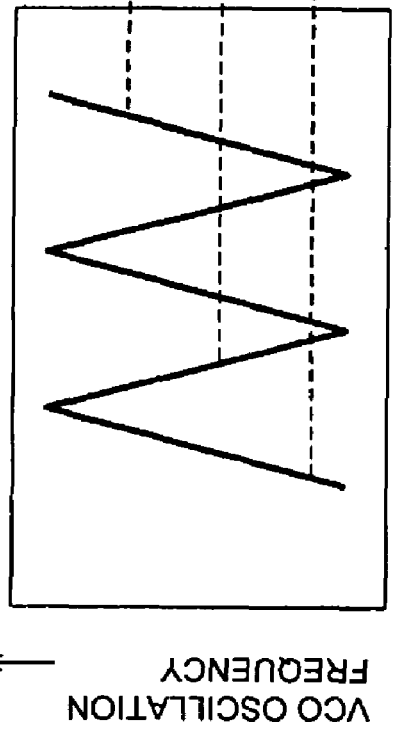
Figure 12C:
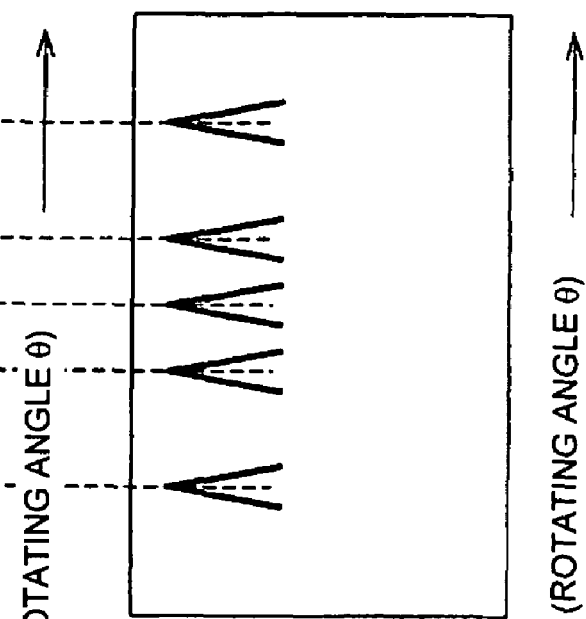

FIG. 11 is a perspective view showing the structure of a rotor 11*d* as another example of the rotor 11 on the bottom side. The rotor lid has a projected wall 35 (referring to FIG. 11, having 3 steps, that is, 0° to 120°, 120° to 240°, and 240° to 360°) that continuously and stepwise increases in height on the outer circumference on the undersurface of the disc portion 31. As a consequence thereof, the rotor 11*c* changes the resonant frequency like a slope. On the other hand, the rotor 11*d* stepwise changes the resonant frequency. In this case, similarly to FIG. 8A, the correcting circuit 6 changes the oscillation frequency of the VCO 2 like triangular modulation waves as shown in FIG. 12A. Simultaneously, as shown in FIG. 12B, the rotor 11*d* is rotated, thereby obtaining a detecting result from the detector 5 as shown in FIG. 12C. The timing of the generated peak is measured.

As a consequence thereof, the use of the rotor 11*d* enables, to be known, whether or not the VCO 2 performs the correct modulation from the triangular modulation waves while transmitting the triangular modulation waves of the FM-CW radar.

Further, the stepwise change of the rotor 11*d* is caused at a plurality of periods, thereby obtaining a plurality of pieces of data per one rotation of the rotor at the number of steps as shown in FIG. 13B, in relation to the change of the oscillation frequency of the VCO 2 shown in FIG. 13A, similarly to FIG. 12A. A detecting result shown in FIG. 13C is obtained from the detector 5.

As a consequence thereof, it is possible to obtain a large number of pieces of data from the triangular modulation waves for the same time with the above rotor while transmitting the triangular modulation waves of the FM-CW radar.

Figure 14A:
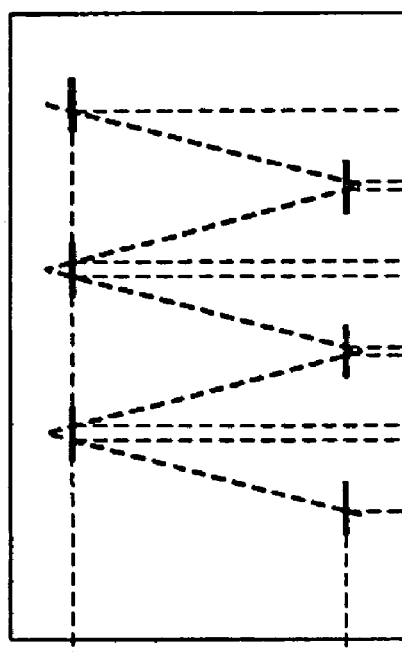
FIGS. 14A-14C are graphs explaining another measurement operation of the oscillation frequency of the correcting circuit.
Figure 14B:
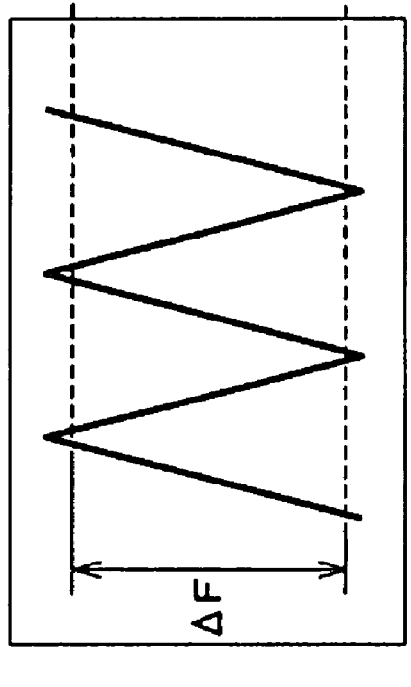
Figure 14C:
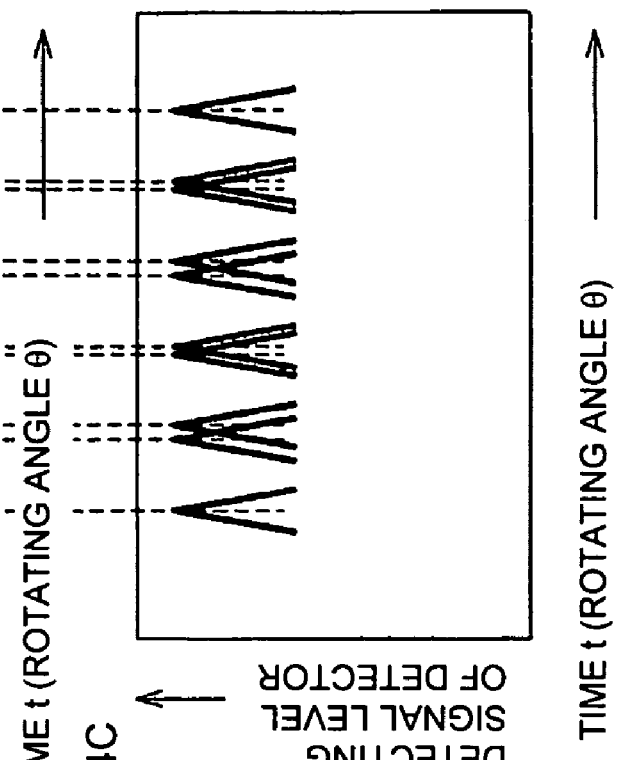

Further, the rotor 11*d* is stepwise changed near both-end values of the oscillation frequency of the VCO 2 as shown in FIGS. 14A-14C. Thus, a modulation width AF can be corrected. FIGS. 14A to 14C correspond to FIGS. 13A to 13C or FIGS. 12A to 12C.

Second Embodiment

Hereinbelow, a description is given of the second embodiment of the present invention with reference to FIGS. 15 and 16.

Figure 15:
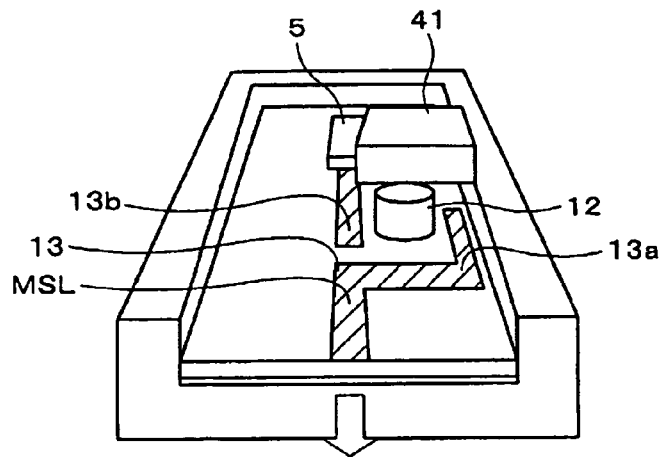
FIG. 15 is a perspective view showing the structure for changing a resonant frequency of a transmission-type resonant circuit in an oscillator used for the FM-CW radar according to a second embodiment of the present invention.
Figure 16:
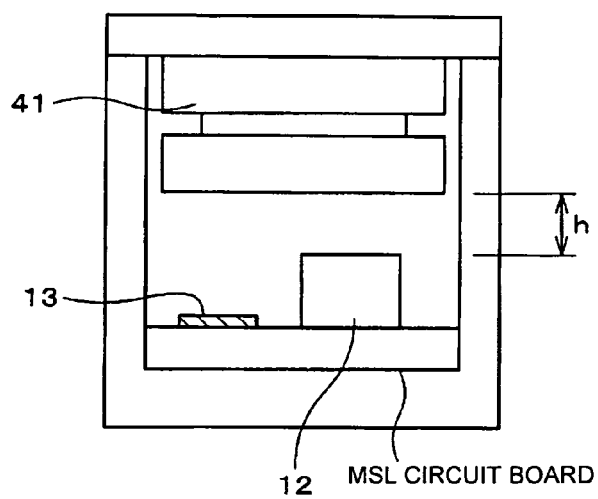
FIG. 16 is a longitudinal cross-sectional view of FIG. 15.

FIG. 15 is a perspective view showing the structure for changing a resonant frequency of a transmission-type resonant circuit in an oscillator shown used for the FM-CW radar according to the second embodiment of the present invention. FIG. 16 is a longitudinal cross-sectional view of FIG. 15. The structure shown in FIG. 15 is similar to that shown in FIG. 2, corresponding portions are designated by the same reference numerals, and a description thereof is omitted. Attention should be paid that, in the case of changing the dimension of the resonant cavity, the oscillator 1 uses the rotor 11 rotated by the motor and the shape is changed in the circumferential direction. On the other hand, the oscillator uses a piezoelectric actuator 41, facing the resonator 12. That is, a control signal from the correcting circuit 6 is sent to the piezoelectric actuator 41, a height h of the resonator 12 from the top surface thereof on the bottom surface of the piezoelectric actuator 41 changes, thereby changing the resonant frequency.

Further, in the case of using a high-frequency signal, such as millimeter waves, the above-mentioned electrical method cannot change the resonant frequency. On the other hand, the mechanical method can change the resonant frequency and can detect the oscillation frequency, thereby obtaining the high linearity and high frequency-characteristic with low costs.

Third Embodiment

Hereinbelow, a description is given of the third embodiment of the present invention with reference to FIGS. 17 to 30. According to the first and second embodiments, the variable resonator 7 directly changes the resonant frequency of the resonator with mechanical means. On the other hand, according to the third embodiment, the resonant frequency of the resonator is changed with a variable reactance device connected to the resonator.

Figure 17:
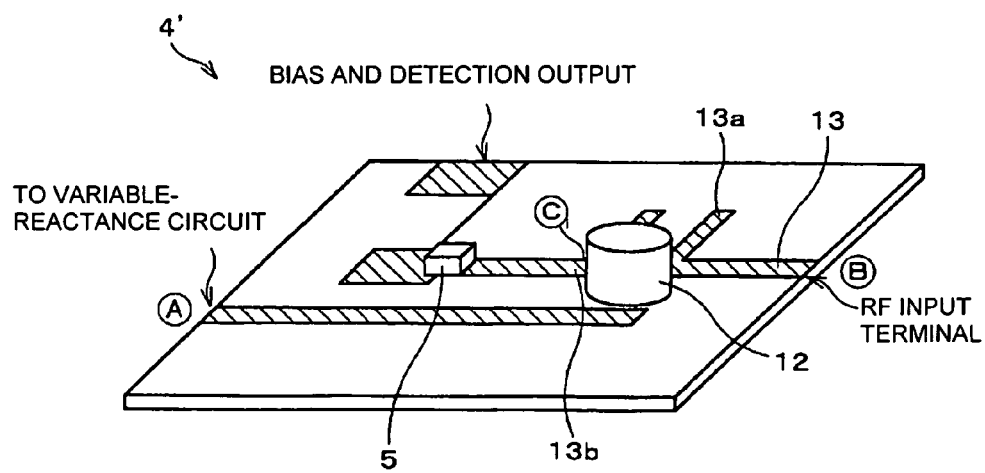
FIG. 17 is a perspective view showing the structure of a circuit board of a transmission-type resonant circuit as an example thereof according to a third embodiment of the present invention.

According to the third embodiment, an example is given of detecting the oscillation frequency of a VCO with a transmission-type resonant circuit. FIG. 17 is a perspective view showing the structure of a circuit board of a transmission-type resonant circuit 4', in place of the transmission-type resonant circuit 4 according to the first embodiment, as an example thereof according to the third embodiment of the present invention. The structure corresponding to the block diagram shown in FIG. 1 is designated by the same reference numeral. Further, reference symbols B and C denote corresponding terminals. Further, reference symbol A denotes a terminal connected to a variable reactance device (not shown). The transmission-type resonant circuit 4' comprises, on the board, the TE01δ-mode resonator 12 and the micro strip line 13 including the terminals 13*a* and 13*b*.

In the transmission-type resonant circuit 4', RF signals, serving as transmission radar waves, input from the terminal B are partly guided to the detector 5 via the resonator 12. Further, the resonator 12 changes the resonant frequency with the change in reactance of the variable reactance device connected to the terminal A. A detecting result is output from the detector 5. That is, the transmission-type resonant circuit 4' functions as a resonant filter. With the transmission characteristic, similarly to that of the transmission-type resonant circuit 4 as shown in FIG. 3, only components near a peak resonant frequency are passed.

As mentioned above, with the structure shown in FIG. 17, the basic operating principle is similar to that according to the first embodiment. However, the change in reactance value of the variable reactance device changes the resonant frequency of the resonator, thereby detecting the oscillation frequency of the VCO.

Figure 18:
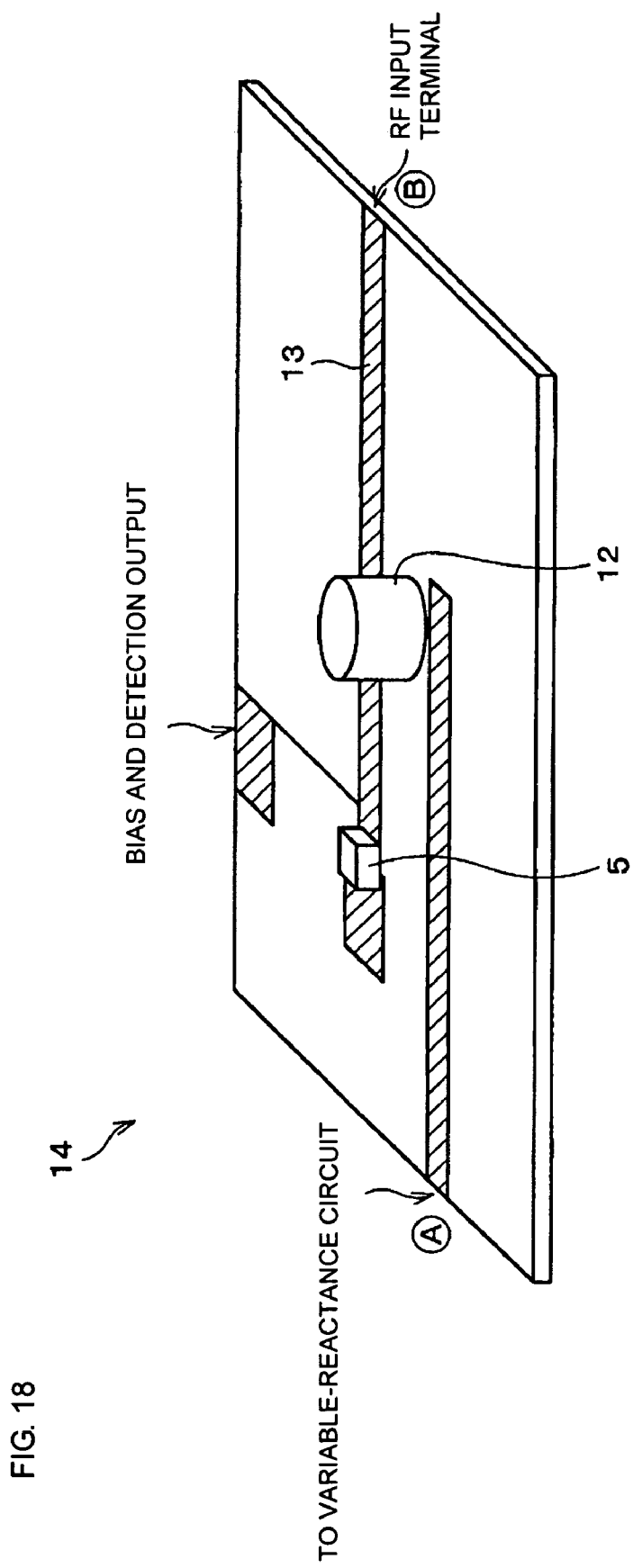
FIG. 18 is a perspective view showing the structure of a circuit board of a reaction-type resonant circuit as an example thereof according to the present invention.
Figure 19:
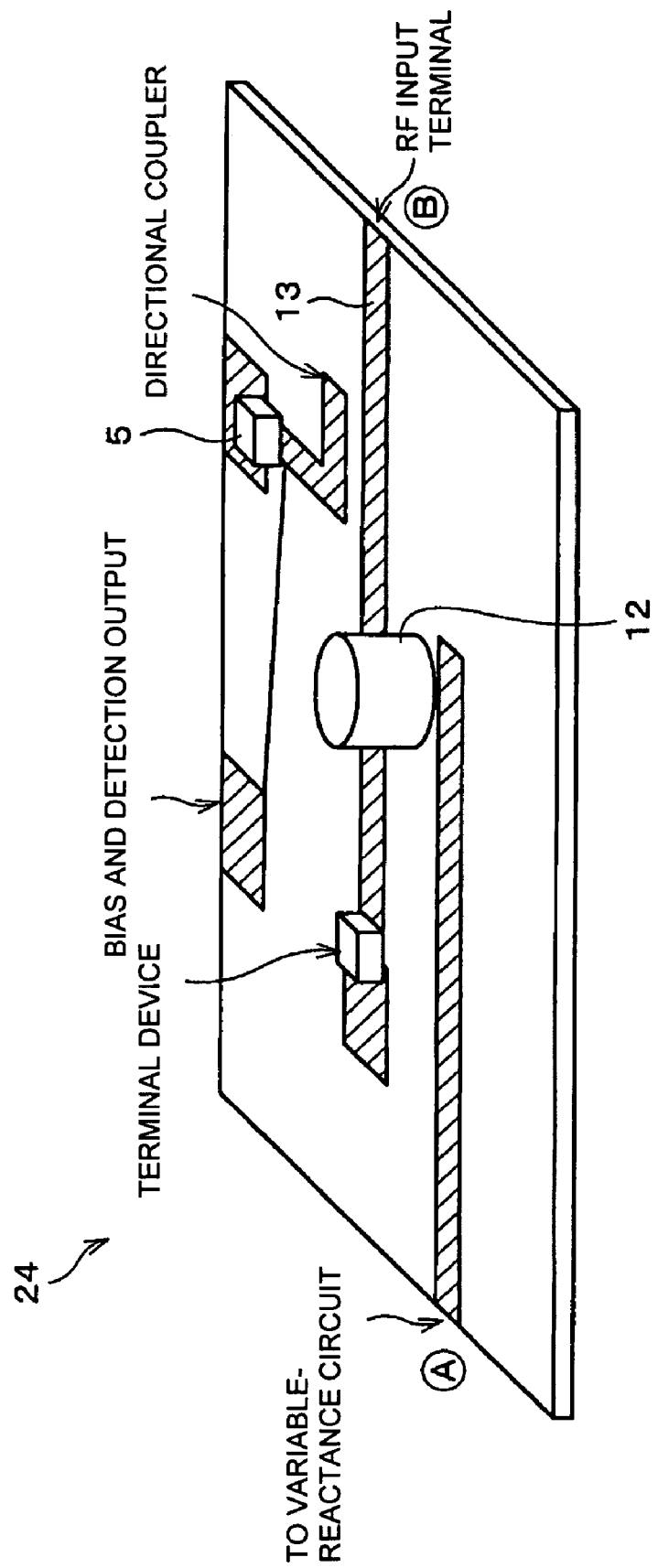
FIG. 19 is a perspective view showing the structure of a circuit board of a reflection-type resonant circuit as an example thereof according to the present invention.

A usable resonant circuit according to the present invention is not limited to the transmission-type resonant circuit 4'. The resonant circuit may be a reaction-type resonant circuit 14 shown in FIG. 18 or a reaction-type resonant circuit 24 shown in FIG. 19. Referring to FIGS. 18 and 19, portions corresponding to those shown in FIG. 17 are designated by the same reference numerals, and a description thereof is omitted.

Figure 20:
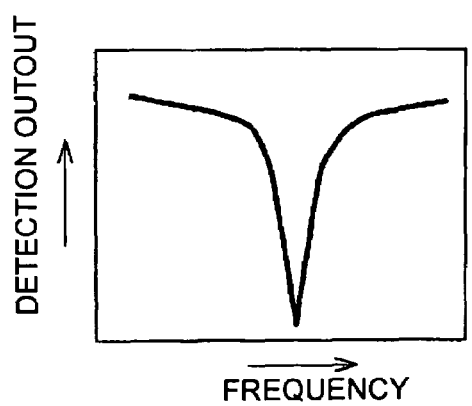
FIG. 20 is a graph showing transmission characteristics of the reaction-type resonant circuit.

With the transmission characteristic of the reaction-type resonant circuit 14, referring to FIG. 20, an output is obtained when the frequency is not resonant, all signal components are bounced when the frequency is resonant, and only components near a dip resonant frequency is cut-off. Further, with the transmission characteristic of the reaction-type resonant circuit 24, when the frequency is resonant, all signal components are bounced, only components near a peak resonant frequency are passed, and the result is similar to that of the transmission-type resonant circuit 4 shown in FIG. 3.

A description is given of the variable reactance device (variable reactance circuit) shown in FIGS. 17 to 19 with reference to FIGS. 21 to 25.

Figure 21:
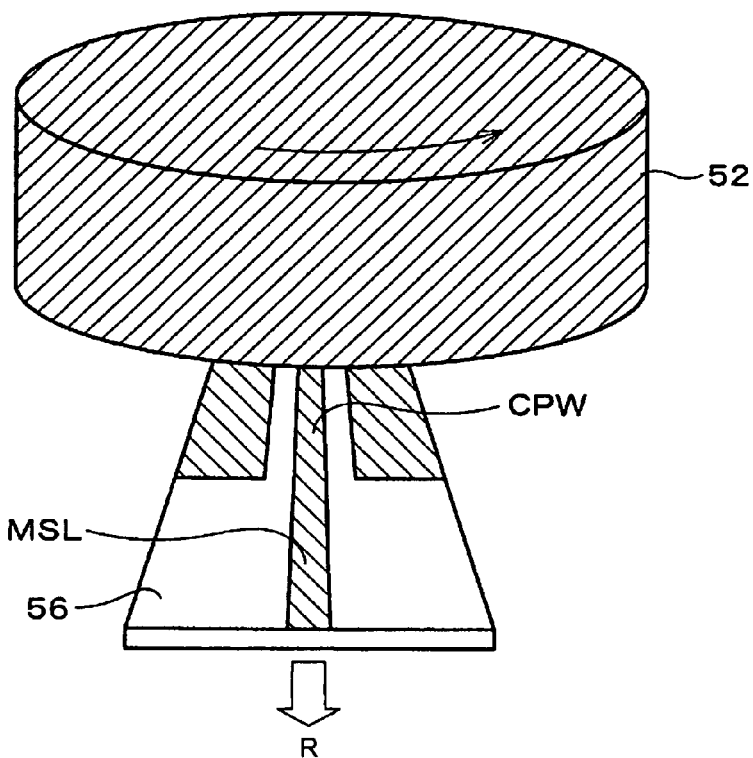
FIG. 21 is a perspective view showing the structure of a variable reactance device in an oscillator according to the third embodiment of the present invention.

FIG. 21 is a perspective view showing the structure of a variable reactance device 51. The variable reactance device 51 comprises: a rotor 52 that is rotated by a motor (not shown); and a board 56 that is connected to the rotor 52 by capacitance. On the board 11, a coplanar line CPW to which the rotor 52 is close is formed. The end of the coplanar line CPW is changed to a micro strip line MSL. The End of the micro strip line MSL is connected to a resonator in the direction shown by an arrow R.

Figure 22:
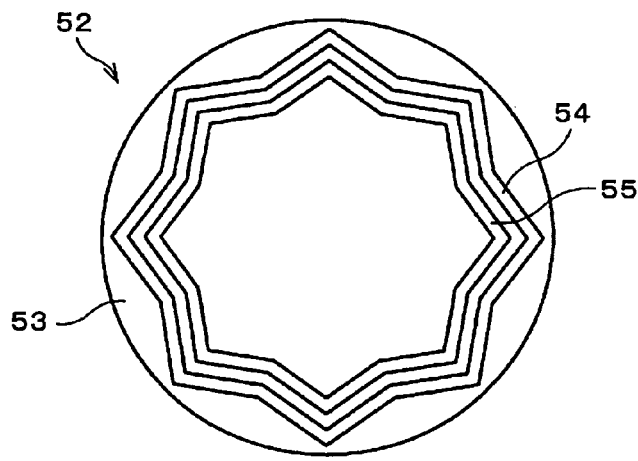
FIG. 22 is a bottom view showing a rotor in the variable reactance device shown in FIG. 21.
Figure 23:
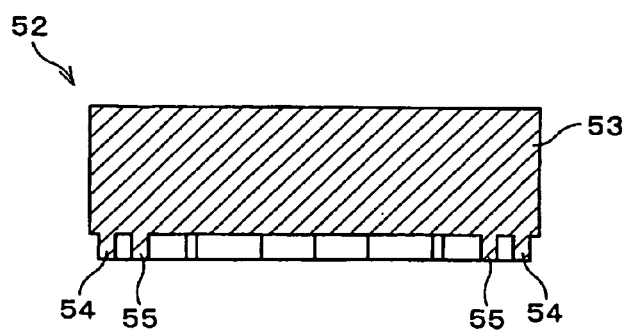
FIG. 23 is a longitudinal cross-sectional view of one diameter line in FIG. 22.
Figure 24:
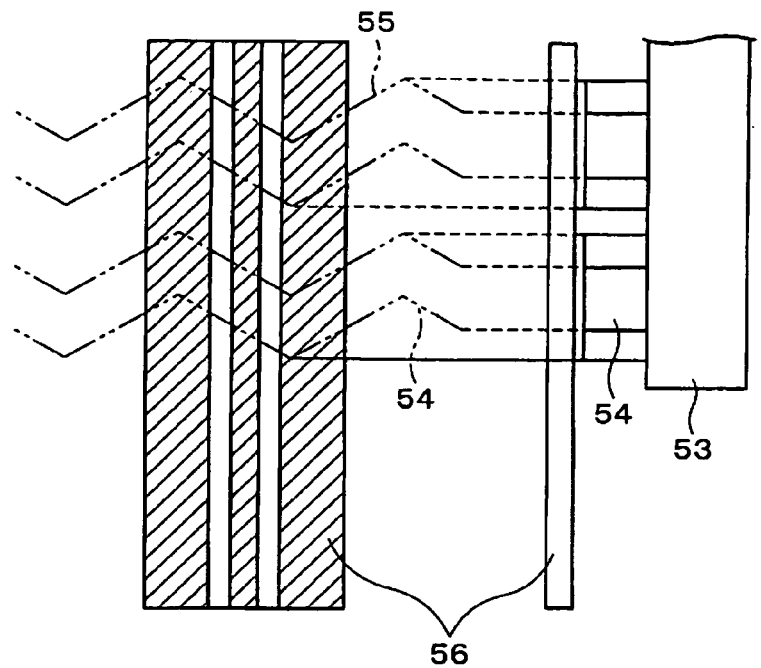
FIG. 24 is a diagram showing the locus of a projected wall of the rotor on the board.

FIG. 22 is a bottom view showing the rotor 52, and FIG. 23 is a longitudinal cross-sectional view of one diameter line shown in FIG. 22. Roughly, the rotor 52 has two projected wall 54 and 55 in a concentric fashion on the undersurface of the disc portion 53. The projected walls 54 and 55 are shaped like walls having an equal height from the undersurface of the disc portion 53. The projected walls 54 and 55 are roughly shaped with rings, and are meandered like triangular modulation waves in the radial direction in parallel therewith. The meandering changes the positions (loci of the rotor 52 in the radial direction) of the projected walld 54 and 55 on the board 56 as shown in FIG. 24. The positional change results in the change in reactance. As a consequence thereof, the number of meandering and the rotating velocity determine the modulation frequency of the triangular modulation waves. The rotor 52 with the above structure contains a metallic material or is formed by metallizing the surface of a resin member, or comprises a dielectric.

The board 56 has a coplanar line on the side of the rotor 52 and a micro strip line on the opposite side, and an end on the opposite side is connected to the resonator. As a consequence thereof, the positional change in the projected walls 54 and 55 changes the distance between the projected walls 54 and 55 and both ends of the board 56, thereby changing the reactance as mentioned above.

Figure 25A:
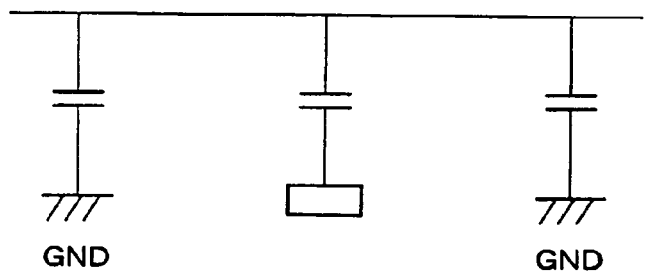
FIG. 25A is an equivalent-circuit diagram when the rotor is a conductor.

FIG. 24 is a plan view showing the facing portion of the rotor 52 and the board 56. When the rotor 52 faces the board 56 having the coplanar line and when the rotor 52 comprises a conductor, an equivalent circuit shown in FIG. 25A is obtained. As a consequence thereof, the rotation of the rotor 52 changes the positions of the projected walls 54 and 55, thereby changing the position of the capacitance shown in FIG. 25A. Thus, the reactance changes and the resonant frequency also changes.

Figure 25B:
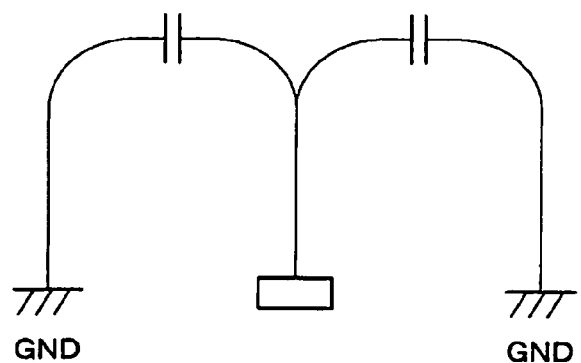
FIG. 25B is an equivalent-circuit diagram when the rotor is a dielectric.

Further, when the rotor 52 comprises a dielectric, an equivalent circuit shown in FIG. 25B is obtained. Similarly, the rotation of the rotor 52 changes the positions of the projected wall 54 and 55, thereby changing the capacitance shown in FIG. 25B. Thus, the reactance changes and the resonant frequency also changes.

The shape of the projected walls 54 and 55 are meandered like triangular modulation waves as shown in FIG. 22, thereby roughly changing the oscillation frequency of the resonator like triangular modulation waves. Further, even when the relationship between the positional change in capacitance and the resonant frequency is not linear, the oscillation frequency can be corrected with the shape of the projected walls 54 and 55, and the resonant frequency can be easily triangle-modulated with accuracy at a constant rotating velocity or less.

Note that the variable reactance device 51 includes the two projected walls 54 and 55 for the purpose of improving the linearity of the positional change. Obviously, even one projected wall changes the phase and, alternatively, three or more projected strips may be provided. Further, a plurality of meandering operations are performed on the circle as shown in FIG. 22, the triangle modulation is repeated per one rotation of the rotor 52 by the number of meandering times. Obviously, the number of modulation times per one rotation may be reduced by reducing the number of meandering times from one to several.

Figure 26:
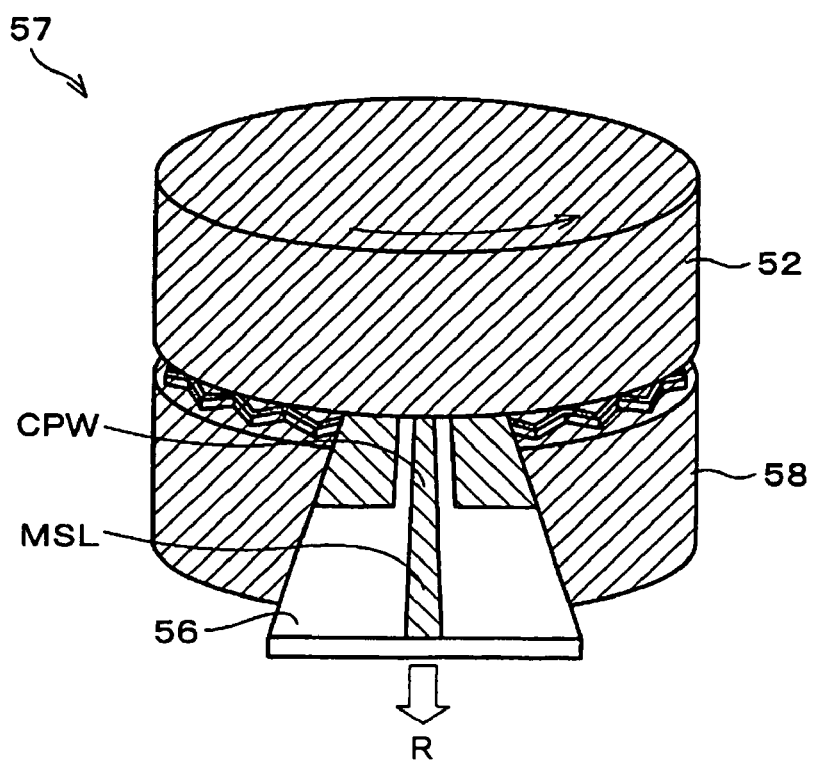
FIG. 26 is a perspective view showing the structure of a variable reactance device according to one modification of the third embodiment.

Hereinbelow, a description is given of a variable reactance device according to one modification with reference to FIG. 26. FIG. 26 is a perspective view showing the structure of a variable reactance device 57 according to one modification of the third embodiment. The variable reactance device 57 is similar to the variable reactance device 51, corresponding portions are designated by the same reference numerals, and a description thereof is omitted. Attention should be paid to the arrangement of another rotor 58, sandwiching the board 56 (transfer line), in addition to the rotor 52 in the variable reactance device 57.

As a consequence thereof, when the rotors 52 and 58 are displaced in the axial direction, the total of intervals between the rotors 52 and 58 and the board 56 is always constant. For example, when one rotor 52 is in proximity of the board 56 and the capacitance increases, the other rotor 58 is apart from the board and the capacitance reduces. Thus, the change in capacitance to the axial displacement can be suppressed.

Figure 27:
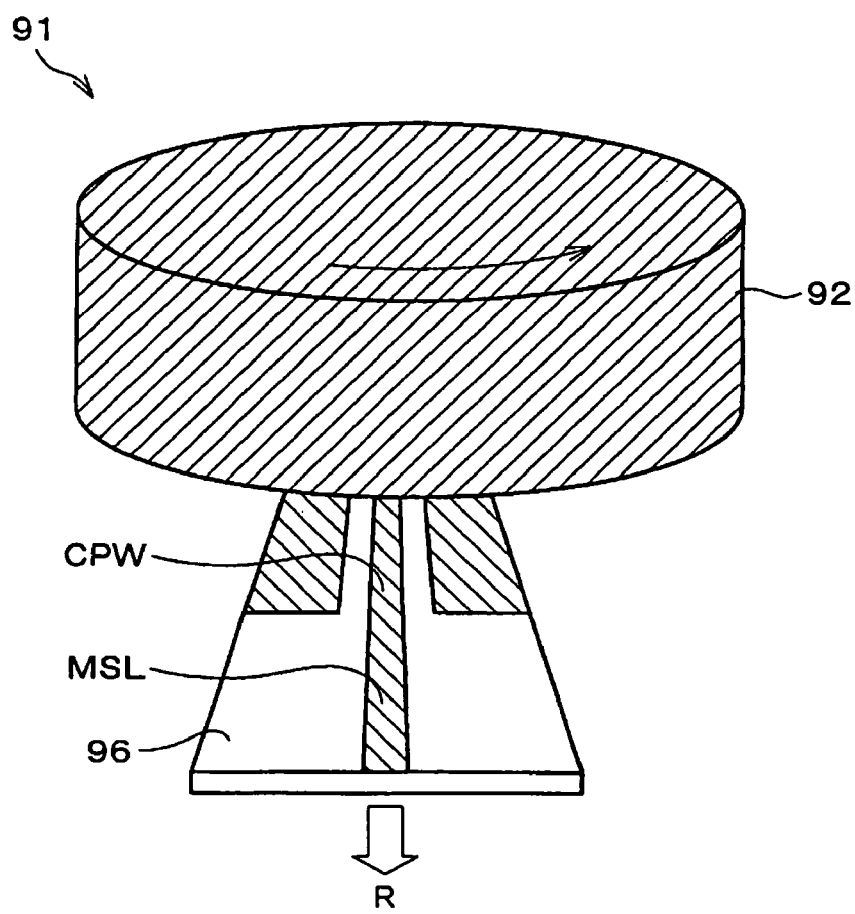
FIG. 27 is a perspective view showing the structure of a variable reactance device according to another modification of the third embodiment.
Figure 28:
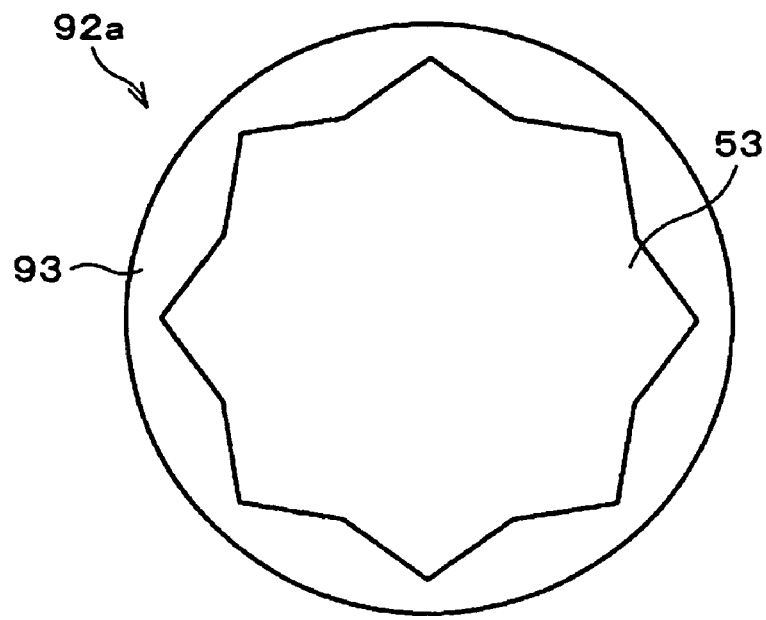
FIG. 28 is a bottom view showing the structure of the rotor in the variable reactance device shown in FIG. 27 as one example thereof.
Figure 29:
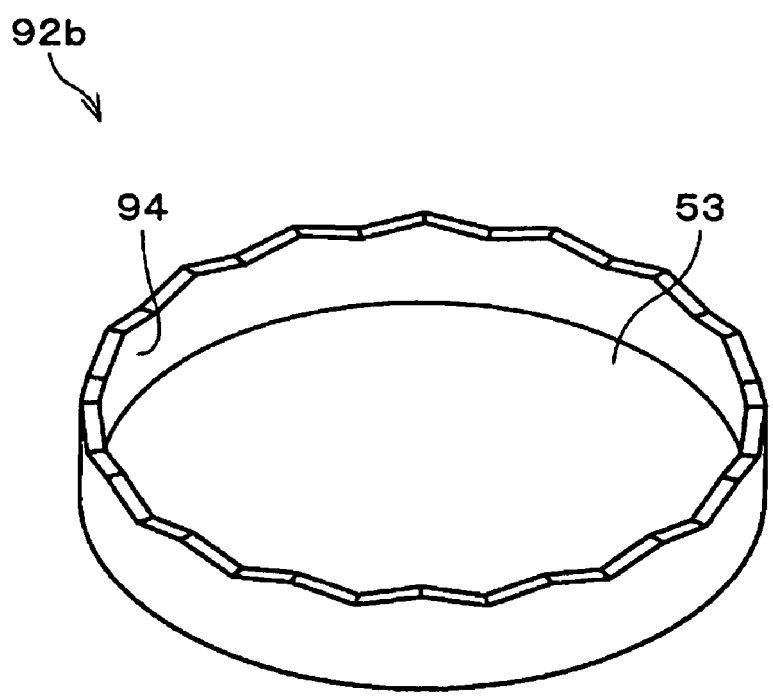
FIG. 29 is a perspective view showing the structure of the rotor in the variable reactance device shown in FIG. 27 as another example thereof.

Further, a description is given of a reactance device according to another embodiment with reference to FIGS. 27 to 29. FIG. 27 is a perspective view showing the structure of a variable reactance device 91 according to another modification of the third embodiment. The variable reactance device 91 is similar to the variable reactance device 51, corresponding portions are designated by the same reference numerals, and a description thereof is omitted. The rotation of the rotor 52 changes the positions of the projected strips 54 and 55 in the radial direction and, thus, the variable reactance device 51 changes the impedance of the transfer line and performs the triangle modulation. Attention should be paid to the variable reactance device 91 in which the rotation of a rotor 92 changes the capacitance so as to perform the triangle modulation.

Specifically, referring to FIG. 28, a rotor 92a changes the electrode area. In this case, the rotor 92a has an outer wall 93 that is extended from the undersurface of the disc portion 53. The thickness of the outer wall 93 periodically changes in the circumferential direction. The rotor 92a also contains a metallic material or is formed by metallizing a resin surface. A board 96 has a coplanar line on the side of the rotor 92a and a micro strip line on the side of the resonator.

Further, referring to FIG. 29, a rotor 92b changes the distance between an electrode and the board 96. In this case, the rotor 92b has an outer wall 94 that is extended from the undersurface of the disc portion 53. The outer wall 94 is shaped like triangular modulation waves. The rotor 92b contains a metallic material or is formed by metallizing a resin surface. Further, the rotor 92b may comprise a dielectric. In this case, as shown in FIG. 25B, the capacitance is not generated between the rotor 92b and the transfer line. The capacitance between a hot signal-line and the ground is changed. That is, the dielectric has a large $\epsilon$ and, therefore, the capacitance between the hot signal-line and the ground increases when the rotor 92b is in the proximity of the board 96, and it reduces when the rotor 92b is apart from the board 96.

Figure 30:
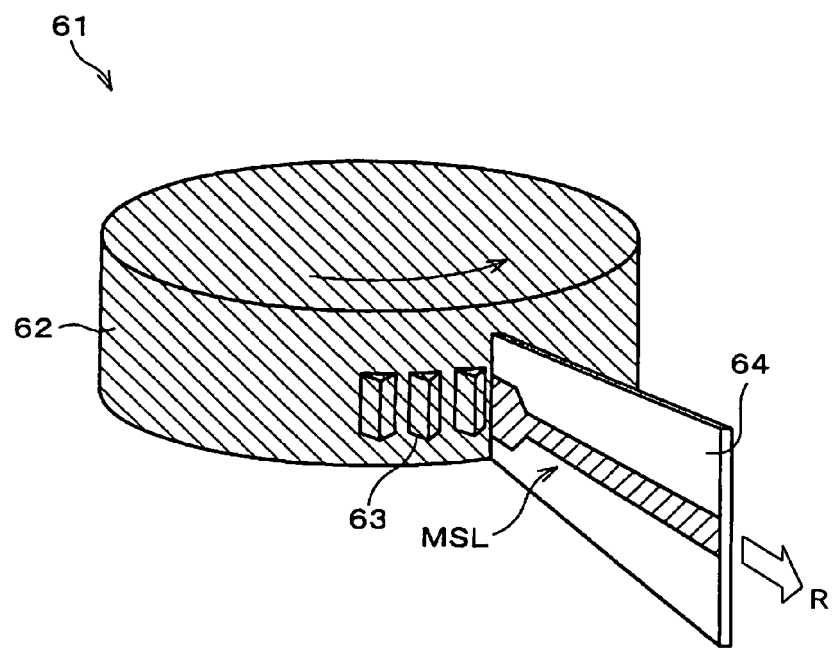
FIG. 30 is a perspective view showing the structure of a variable reactance device according to another modification of the third embodiment.

A description is given of a variable reactance device according to another modification with reference to FIG. 30. FIG. 30 is a perspective view showing the structure of a variable reactance device 61 as a variable reactance device according to another modification. Attention should be paid to that the variable reactance device 61 uses an edge couple of a board 64 having a micro strip line. Specifically, projected and caved portions 63 like triangular modulation waves are repeatedly formed in the circumferential direction on the outer circumference of the rotor 62. Corresponding thereto, the board 64 faces the outer circumference of the rotor 62 in the thickness direction that matches the circumferential direction of the rotor 62. The board 64 has a micro strip line MSL, and an end thereof is connected to a resonator existing in a direction shown by an arrow R.

As a consequence thereof, when the projection is close to an open end of the micro strip line, the capacitance increases. When the caved portion is close to the open end of the micro strip line, the capacitance reduces.

With the above variable reactance devices, the resonant frequency of the resonator 12 can be changed.

Fourth Embodiment

Hereinbelow, a description is given of the fourth embodiment of the present invention with reference to FIG. 31.

Figure 31:
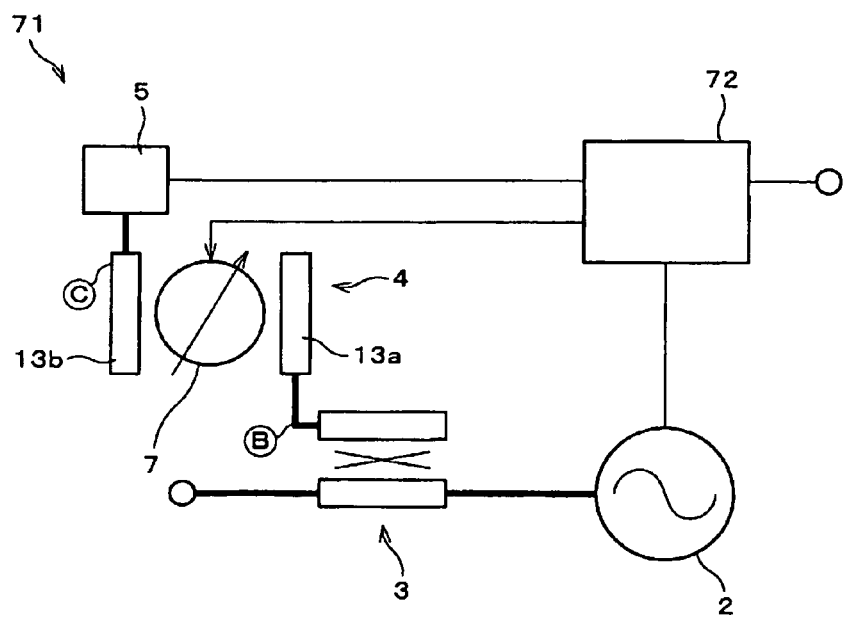
FIG. 31 is a block diagram showing the electrical structure of an oscillator used for the FM-CW radar according to a fourth embodiment of the present invention.

FIG. 31 is a block diagram showing the electrical structure of an oscillator 71 used for the FM-CW radar according to the fourth embodiment of the present invention. The oscillator 71 is similar to the oscillator 1 shown in FIG. 1, corresponding portions are designated by the same reference numerals, and a description thereof is omitted. Attention should be paid to that the oscillator 71 has a function as an abnormality detecting device that detects the oscillation frequency and transmits a notification indicating the abnormality to an upper system, as compared with the oscillator 1 that detects and corrects the oscillation frequency.

That is, the oscillation frequency can be known from a peak output timing of the detector 5, as mentioned above. At the peak output timing, i.e., when the oscillation frequency is out of a preset frequency-range, an abnormality detecting circuit 72 is operated, thereby outputting an abnormal signal.

Similarly, the linearity abnormality can be detected by detecting the change of a plurality of frequencies (i.e., out of the set frequency). Further, the abnormality of the modulation width ΔF can be detected by detecting the change (out-of-range of the set frequency) of frequencies of the upper and lower limits within the range of the oscillation frequency. The above abnormality detection can be realized by using any of changing sequences of the resonant frequency of the variable resonators for correcting the oscillation frequency according to the first to third embodiments.

Fifth Embodiment

Hereinbelow, a description is given of the fifth embodiment of the present invention with reference to FIGS. 32 and 33.

Figure 32:
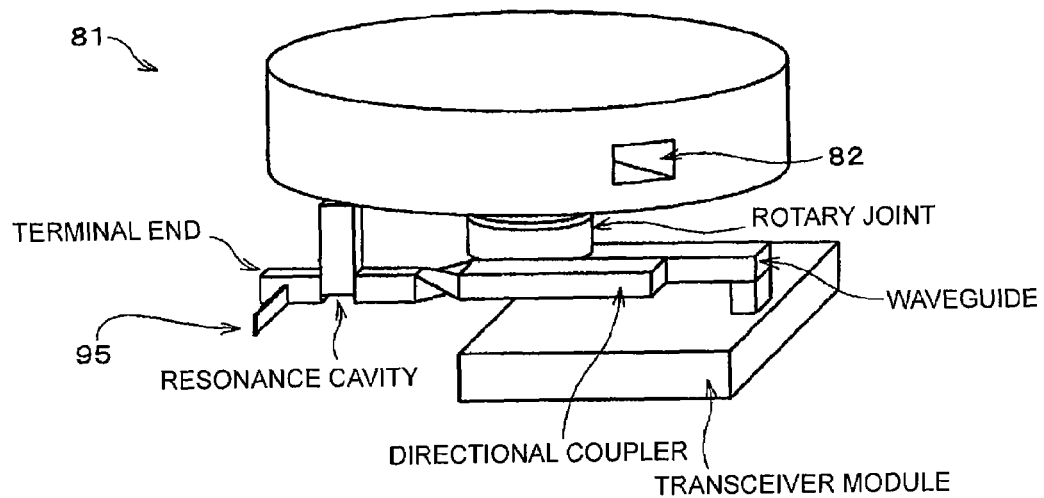
FIG. 32 is a perspective view showing the structure of a radar module according to a fifth embodiment of the present invention.

FIG. 32 is a perspective view showing the structure of a radar module (radar apparatus) 81 according to the fifth embodiment of the present invention. The radar module 81 is a radar module that scans a directional angle with a rotatable primary radiator 82. The primary radiator 82 functions as the rotor 11, and the bottom surface thereof is mechanically processed to change the dimension of the resonant cavity as mentioned above. For the purpose of FM-CW operation, a VCO (not shown) performs triangle modulation at a high velocity.

Figure 33:
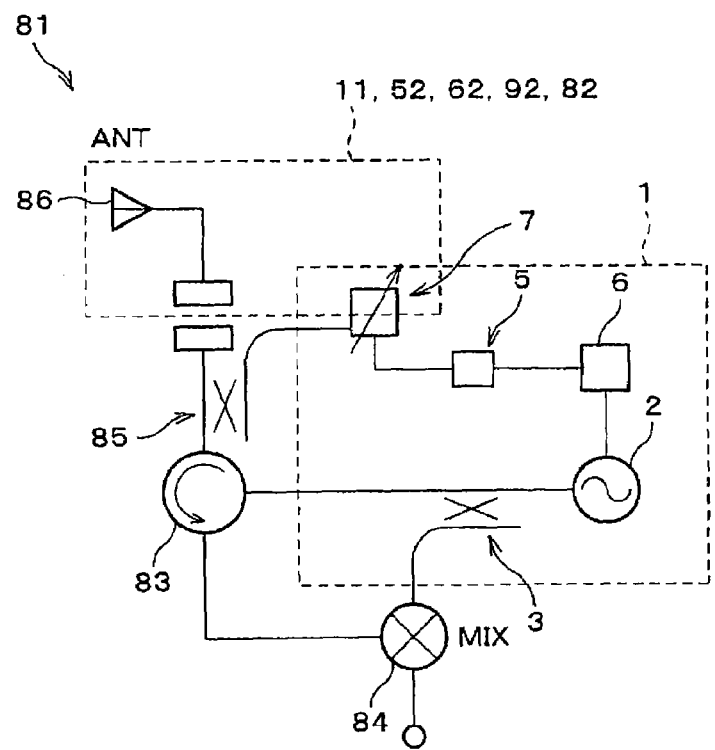
FIG. 33 is a block diagram showing the electrical structure of the radar module shown in FIG. 32.

FIG. 33 is a block diagram showing the electrical structure of the radar module 81 shown in FIG. 32. The radar module 81 uses the oscillator 1. In the radar module 81, the variable resonator 7 changes the resonant frequency. Further, in the oscillator 1, the detector 5 detects a signal output from the variable resonator 7, and the variable resonator 7 is corrected so that the single is set to a desired frequency by a control signal output from the correcting circuit 6 in accordance with the detecting result. Thus, the VCO 2 sets a modulation voltage so as to output an RF signal with a desired frequency. As mentioned above, a closed loop with the above structure is operated as a PLL, thereby accurately setting the frequency of the RF signal to a desired frequency.

The RF signal is branched by the directional coupler 3, and is input to a circulator 83 and a mixer 84. A modulation signal input to the circulator 83 is radiated from an antenna 86 via a coupler 85 and rotary joint. Further, the signal received by the antenna 86 is transmitted via the circulator 83 to the mixer 84. The mixer 84 mixes the transmission (modulation) signal branched by the directional coupler 3 and a reception signal from the circulator 83, thereby generating and outputting a beat signal. Further, the signal branched by the coupler 85 is input to the variable resonator 7.

In the radar module 81, the dimension of the resonant cavity varies, depending on the angle of the primary radiator (rotor) 82. Thus, the resonant frequency changes. Without the method shown in FIG. 7, but with the method shown in 8 (not zigzag waves but triangular modulation waves), it is possible to know the change of the oscillation frequency of the VCO 2. The oscillation frequency can be corrected on the basis of the information. The correcting circuit is connected to a detector output terminal of a detector board 95 shown in FIG. 32. Further, the correcting circuit has means that controls the rotation of the primary radiator (rotating unit) 82 or knows a rotating angle, and has a function that detects the oscillation frequency of the VCO from the output timing of the detector and the modulation timing of the VCO and corrects the frequency that is displaced from a desired frequency.

When the radar does not perform the scanning operation at an angle of 360°, a pause period without the radar operation exists. For the pause period, data can be obtained to correct the VCO. In this case, the frequency modulation of the VCO is performed, irrespective of the triangular modulation waves. Therefore, with the method shown in FIG. 7 or the method with the zigzag waves shown in FIG. 9, data is obtained by arbitrary modulation, the information is stored, and the modulation can be corrected with the information. As mentioned above according to the third embodiment, the resonant frequency of the resonator may be changed by changing the reactance value of the variable reactance device with the rotor.

The rotor 11 is shared with the primary radiator 82 that scans the radar waves, thereby simplifying the structure of the scan-type radar apparatus. Further, in the variable resonator 7, with the variable reactance devices 51, 57, 61, and 91 connected to the resonator, the resonant frequency of the resonator may be changed. With the above structure, the rotors 52, 62, and 92 are shared with the primary radiator 82 that scans the radar waves, thereby simplifying the structure of the scan-type radar apparatus.

Further, in the structure, the abnormality detecting circuit 72 shown in FIG. 31 is connected to the detector output terminal of the detector board 95, in place of the correcting circuit. Thus, it is possible to realize a radar module that detects the abnormality of oscillation frequency, the linearity abnormality, and the abnormality of modulation width, and to output the signal indicating the abnormality to the upper system.

Obviously, it is possible to realize an RF apparatus and a radar module having both the functions of the correcting circuit and the abnormality detecting circuit by the combination of the present invention.

Sixth Embodiment

Hereinbelow, a description is given of the sixth embodiment of the present invention with reference to FIGS. 34 to 36.

Figure 34:
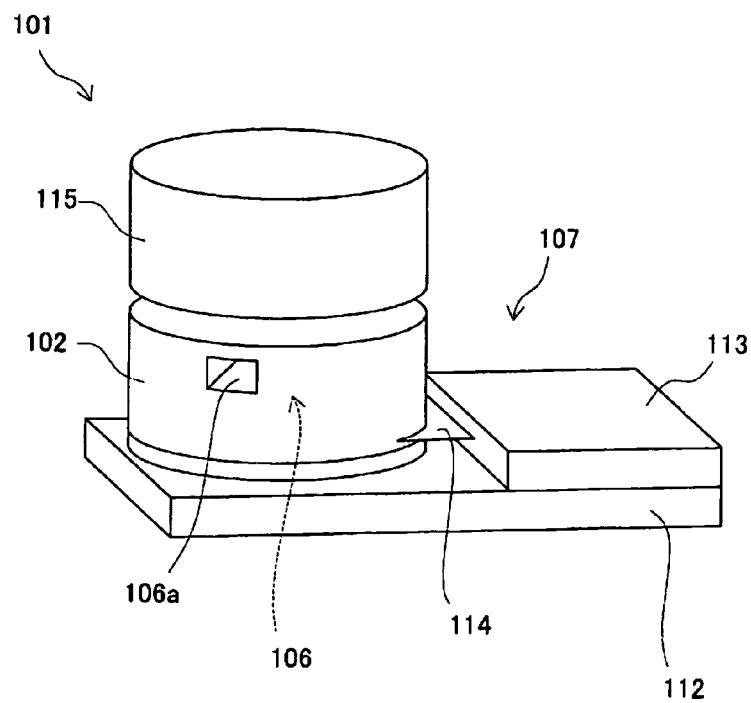
FIG. 34 is a perspective view showing the structure of a radar apparatus according to the sixth embodiment of the present invention.

FIG. 34 is a perspective view showing the entire structure of a radar apparatus 101 according to the sixth embodiment of the present invention. The radar apparatus 101 is roughly formed by mounting a frequency detecting circuit 113 on an RF (high frequency) circuit board 112, and has an antenna 102 of radar waves. A rotor of a variable reactance device in the frequency detecting circuit 113 is shared with the antenna 102. The antenna 102 has an opening 106a for radiating radar waves on the side thereof. The antenna 102 is rotated by a motor 115, and scans the radar waves irradiated.

Figure 35:
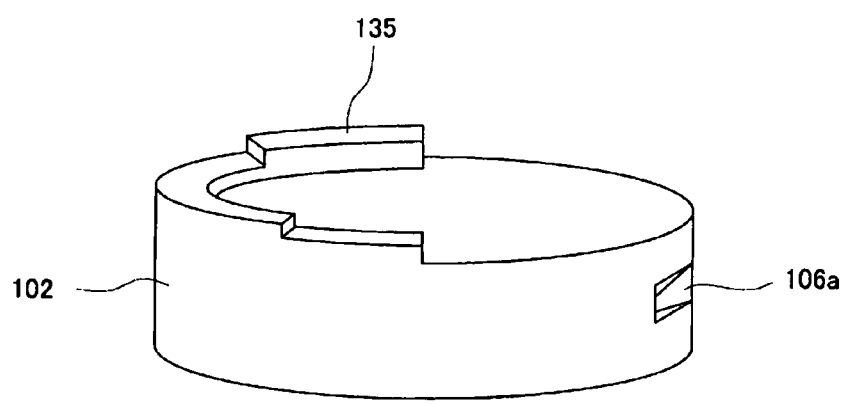
FIG. 35 is a perspective view showing an antenna in the radar apparatus shown in FIG. 34 on the bottom side.

FIG. 35 is a perspective view showing the antenna 102 in the radar apparatus on the bottom side thereof. The antenna 102 is shared with a rotor of the variable reactance device. Similarly to that shown in FIG. 11, a projected wall 135 is formed with the height that stepwise increases on the outer circumference on the undersurface of the antenna 102. In the example, the height increases at three steps of 0° to 60°, 60° to 120°, and 120° to 180°. The variable reactance device comprises the antenna 102 and a board similar to the board 56 shown in FIG. 21.

Figure 36:
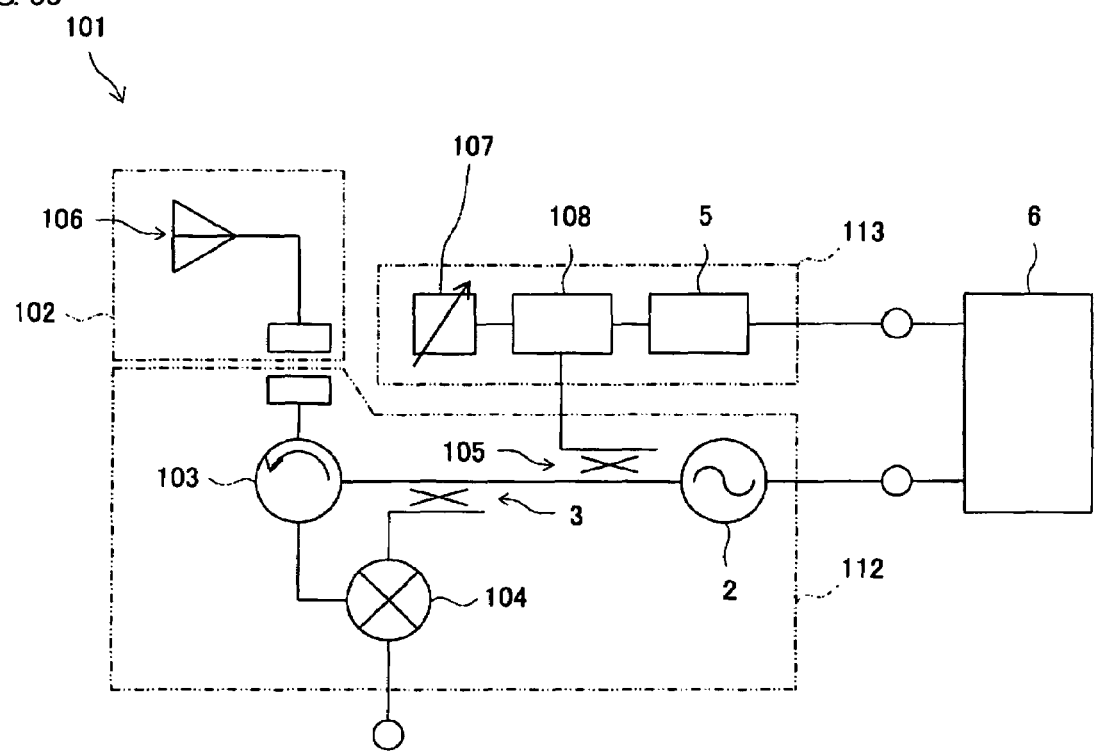
FIG. 36 is a block diagram showing the electrical structure of the radar apparatus shown in FIG. 34.

FIG. 36 is a block diagram showing the electrical structure of the radar apparatus 101 with the above structure. In the radar apparatus 101, the variable reactance device 107 changes the resonant frequency of the resonator 108, and the detector 5 captures the resonant signal and inputs the resonant signal to the correcting circuit 6.

On the RF circuit board 112, the resonator 108 is connected to a transfer line of the oscillation signal of the VCO 2 via the coupler 105. The oscillation signal of the VCO 2 is branched by the coupler 3, and the branched signal is input to the circulator 103 and the mixer 104. The modulation signal input to the circulator 103 is radiated from the primary radiator 106 included in the antenna 102. A signal received by the antenna 106 is propagated to the mixer 104 via the circulator 103. The mixer 104 mixes a transmission (modulation) signal branched by the coupler 3 and the reception signal from the circulator 103, thereby generating and outputting the beat signal.

Referring to FIG. 35, the antenna 102 has, on the bottom surface thereof, an angle range having the projected wall 135 with the height that stepwise increases and a flat angle range without the projected wall. When the direction of the antenna is out of a range of a predetermined detected angle in front of the vehicle, the angle range of the projected wall 135 faces the line of the board of the variable reactance device. As a consequence thereof, in accordance with the rotation of the antenna 102, the reactance of the variable reactance device changes at 3 steps.

Similarly to the case shown in FIGS. 12A-12C, the correcting circuit 6 changes the oscillation frequency of the VCO 2 like triangular modulation waves as shown in FIG. 12A. Simultaneously, the correcting circuit 6 rotates the antenna 102 as shown in FIG. 12B. Thus, a detecting result shown in FIG. 12C is obtained from the detector 5, thereby measuring the timing of the generated peak. Correction information for correctly modulating the VCO with triangular waves is obtained, and is set to the correcting circuit 6.

When the direction of antenna is in front of the vehicle (in the search state of the front direction), the angle range without the projected wall 135 faces the line of the board of the variable reactance device. As a consequence thereof, the reactance of the variable reactance device is constant, and the waves correctly modulated with the triangular waves are transmitted, with the triangle waves corrected by the correcting circuit 6, within the range of a predetermined search angle in front of the vehicle.

As mentioned above, the rotor of the variable reactance device 107 is shared with the antenna 106, thereby simplifying the structure of the scan-type radar apparatus.

The invention claimed is:

1. An oscillator for outputting an oscillation signal of a voltage control oscillator via a transfer line, the oscillator comprising:
    a variable resonator that is electro-magnetically connected to the transfer line, receives at least one part of the oscillation signal, and mechanically changes a resonant frequency in response to a control signal;
    a detector that detects a resonant output of the variable resonator; and
    a correcting circuit that transmits the control signal to the variable resonator, receives an output from the detector while sweeping the resonant frequency, and corrects a frequency of the oscillation signal to a desired frequency under the control of a modulation voltage sent to the voltage control oscillator.

2. The oscillator according to claim 1, wherein the variable resonator comprises:
    a resonator; and
    a rotor that is arranged in proximity of the resonator, the rotor having a shape that changes in a circumferential direction thereof,
    wherein the rotation of the rotor changes a distance between the resonator and the rotor, and changes the resonant frequency of the resonator.

3. The oscillator according to claim 1, wherein the variable resonator is a cavity resonator, a part of a cavity of the cavity resonator forming a rotor and having a shape that changes in a circumferential direction thereof, wherein the rotation of the rotor changes an inner dimension of the cavity, and changes the resonant frequency of the cavity resonator.

4. The oscillator according to claim 2, wherein the rotor has a wall that continuously increases in height on the outer circumference on the undersurface thereof.

5. The oscillator according to claim 2, wherein the rotor has a wall that changes its position in the radial direction from an outer circumference to an inner circumference on the undersurface thereof.

6. The oscillator according to claim 2, wherein the rotor has a wall that continuously increases in height throughout half of an outer circumference on the undersurface thereof and continuously reduces in height throughout a remaining half.

7. The oscillator according to claim 1, wherein the variable resonator comprises:
   a resonator that is placed in a cavity; and
   a piezoelectric actuator that is arranged facing the resonator, wherein expansion and contraction of the piezoelectric actuator changes the inner dimension of the cavity, so as to change the resonant frequency of the resonator.

8. The oscillator according to claim 1, wherein the variable resonator comprises:
   a resonator; and
   a variable reactance device, the variable reactance device comprising a transfer line that is electro-magnetically connected to the resonator; and a rotor that is arranged in proximity of the transfer line, the rotor having a shape that changes in a circumferential direction thereof, wherein the rotation of the rotor changes a reactance of the transfer line, and changes the resonant frequency of the variable resonator.

9. The oscillator according to claim 8, wherein at least one part of the rotor facing the transfer line is conductive, and capacitance is generated between the transfer line and the rotor.

10. The oscillator according to claim 9, wherein the rotor has a wall that is meandered in a radial direction on an undersurface of the rotor.

11. The oscillator according to claim 9, wherein the rotor has an undersurface with a wall, the wall having a thickness that periodically changes in the circumferential direction.

12. The oscillator according to claim 9, wherein the rotor has an undersurface with a wall, the wall having a height that periodically changes in the circumferential direction.

13. The oscillator according to claim 9, wherein the rotor has an outer circumference with projected and caved portions that are repeatedly formed, and
   the transfer line is a micro strip line and the capacitance is generated between an opening end of the micro strip line and the outer-circumferential surface of the rotor.

14. The oscillator according to claim 9, wherein the transfer line is a coplanar line, and capacitance is generated between a line conductor of the coplanar line and the rotor and between a ground conductor of the coplanar line and the rotor.

15. The oscillator according to claim 14, wherein a pair of rotors is arranged to sandwich the transfer line, and the pair of rotors are rotated in conjunction therewith.

16. The oscillator according to claim 8, wherein the rotor comprises a dielectric having a wall that is ring-shaped on an undersurface thereof and is meandered in a radial direction, and the transfer line comprises a coplanar line.

17. The oscillator according to claim 8, wherein the rotor comprises a dielectric, the transfer line comprises a coplanar line, and the rotation of the rotor changes the distance between the rotor and the transfer line.

18. A radar apparatus comprising:
   an oscillator according to claim 1.

19. A radar apparatus comprising:
   an oscillator according to claim 1, wherein the rotor comprises a primary radiator, the rotation of the rotor changes a resonant frequency of the variable resonator, and the primary radiator scans radar waves radiated from the primary radiator in a radial direction thereof.

20. The oscillator according to claim 3, wherein the rotor has a wall that continuously increases in height on the outer circumference on the undersurface thereof.

21. The oscillator according to claim 3, wherein the rotor has a wall that changes its position in the radial direction from an outer circumference to an inner circumference on the undersurface thereof.

22. The oscillator according to claim 3, wherein the rotor has a wall that continuously increases in height throughout half of an outer circumference on the undersurface thereof and continuously reduces in height throughout a remaining half.

23. An oscillator for outputting an oscillation signal of a voltage control oscillator via a transfer line, the oscillator comprising:
   a variable resonator that is electro-magnetically connected to the transfer line, receives at least one part of the oscillation signal, and mechanically changes a resonant frequency in response to a control signal;
   a detector that detects a resonant output of the variable resonator; and
   an abnormality detecting circuit that transmits the control signal to the variable resonator, receives an output from the detector while sweeping the resonant frequency to the variable resonator, detects the oscillation frequency of the voltage control oscillator, and detects an abnormality of an oscillation frequency and/or a modulation width of the oscillation frequency.

* * * * *